United States Patent
Scheuerlein et al.

(10) Patent No.: US 8,120,068 B2
(45) Date of Patent: Feb. 21, 2012

(54) THREE-DIMENSIONAL MEMORY STRUCTURES HAVING SHARED PILLAR MEMORY CELLS

(75) Inventors: Roy E Scheuerlein, Cupertino, CA (US); Eliyahou Harari, Saratoga, CA (US)

(73) Assignee: SanDisk 3D LLC, Milpitas, CA (US)

( * ) Notice: Subject to any disclaimer, the term of this patent is extended or adjusted under 35 U.S.C. 154(b) by 361 days.

(21) Appl. No.: 12/344,022

(22) Filed: Dec. 24, 2008

(65) Prior Publication Data

US 2010/0155784 A1 Jun. 24, 2010

(51) Int. Cl.
    *H01L 27/02* (2006.01)
(52) U.S. Cl. .......... 257/211; 257/E25.013; 257/E27.026
(58) Field of Classification Search ............... 257/211, 257/E25.012, E25.013, E27.026
    See application file for complete search history.

(56) References Cited

U.S. PATENT DOCUMENTS

| | | | |
|---|---|---|---|
| 4,677,742 A * | 7/1987 | Johnson | 438/131 |
| 5,835,396 A | 11/1998 | Zhang | |
| 6,034,882 A | 3/2000 | Johnson et al. | |
| 6,356,477 B1 | 3/2002 | Tran | |
| 6,420,215 B1 | 7/2002 | Knall et al. | |
| 6,515,888 B2 | 2/2003 | Johnson et al. | |
| 6,525,953 B1 | 2/2003 | Johnson | |
| 6,579,760 B1 | 6/2003 | Lung | |
| 6,631,085 B2 | 10/2003 | Scheuerlein et al. | |
| 6,642,603 B1 | 11/2003 | Knall | |
| 6,777,773 B2 | 8/2004 | Knall | |
| 6,951,780 B1 | 10/2005 | Herner | |
| 6,952,043 B2 | 10/2005 | Vyvoda et al. | |
| 6,984,561 B2 | 1/2006 | Herner et al. | |
| 7,005,350 B2 | 2/2006 | Walker et al. | |
| 7,022,572 B2 | 4/2006 | Scheuerlein et al. | |
| 7,081,377 B2 | 7/2006 | Cleeves | |
| 7,285,464 B2 | 10/2007 | Herner et al. | |
| 2002/0081833 A1 | 6/2002 | Li et al. | |
| 2003/0016553 A1 | 1/2003 | Subramanian et al. | |
| 2004/0002184 A1 | 1/2004 | Cleeves | |

(Continued)

FOREIGN PATENT DOCUMENTS

EP    0117045 A    8/1984

OTHER PUBLICATIONS

U.S. Appl. No. 12/468,717, filed May 19, 2009.

(Continued)

*Primary Examiner* — Benjamin Sandvik
*Assistant Examiner* — Wensing Kuo
(74) *Attorney, Agent, or Firm* — Vierra Magen Marcus & DeNiro LLP

(57) ABSTRACT

A three-dimensional non-volatile memory system is disclosed including a memory array utilizing shared pillar structures for memory cell formation. A shared pillar structure includes two non-volatile storage elements. A first end surface of each pillar contacts one array line from a first set of array lines and a second end surface of each pillar contacts two array lines from a second set of array lines that is vertically separated from the first set of array lines. Each pillar includes a first subset of layers that are divided into portions for the individual storage elements in the pillar. Each pillar includes a second subset of layers that is shared between both non-volatile storage elements formed in the pillar. The individual storage elements each include a steering element and a state change element.

29 Claims, 12 Drawing Sheets

U.S. PATENT DOCUMENTS

| | | | |
|---|---|---|---|
| 2004/0002186 A1 | 1/2004 | Vyvoda et al. | |
| 2004/0016991 A1 | 1/2004 | Johnson et al. | |
| 2005/0014322 A1 | 1/2005 | Herner et al. | |
| 2005/0226067 A1* | 10/2005 | Herner et al. | 365/201 |
| 2005/0242386 A1 | 11/2005 | Ang | |
| 2006/0073657 A1 | 4/2006 | Herner et al. | |
| 2006/0250836 A1 | 11/2006 | Herner et al. | |
| 2008/0002456 A1 | 1/2008 | Toda et al. | |
| 2008/0175031 A1 | 7/2008 | Park et al. | |
| 2008/0290335 A1 | 11/2008 | Lin et al. | |
| 2009/0309089 A1 | 12/2009 | Hsia et al. | |

OTHER PUBLICATIONS

International Search Report & The Written Opinion of the International Searching Authority dated Dec. 21, 2009, International Application No. PCT/US2009/058855 filed Sep. 29, 2009.

* cited by examiner

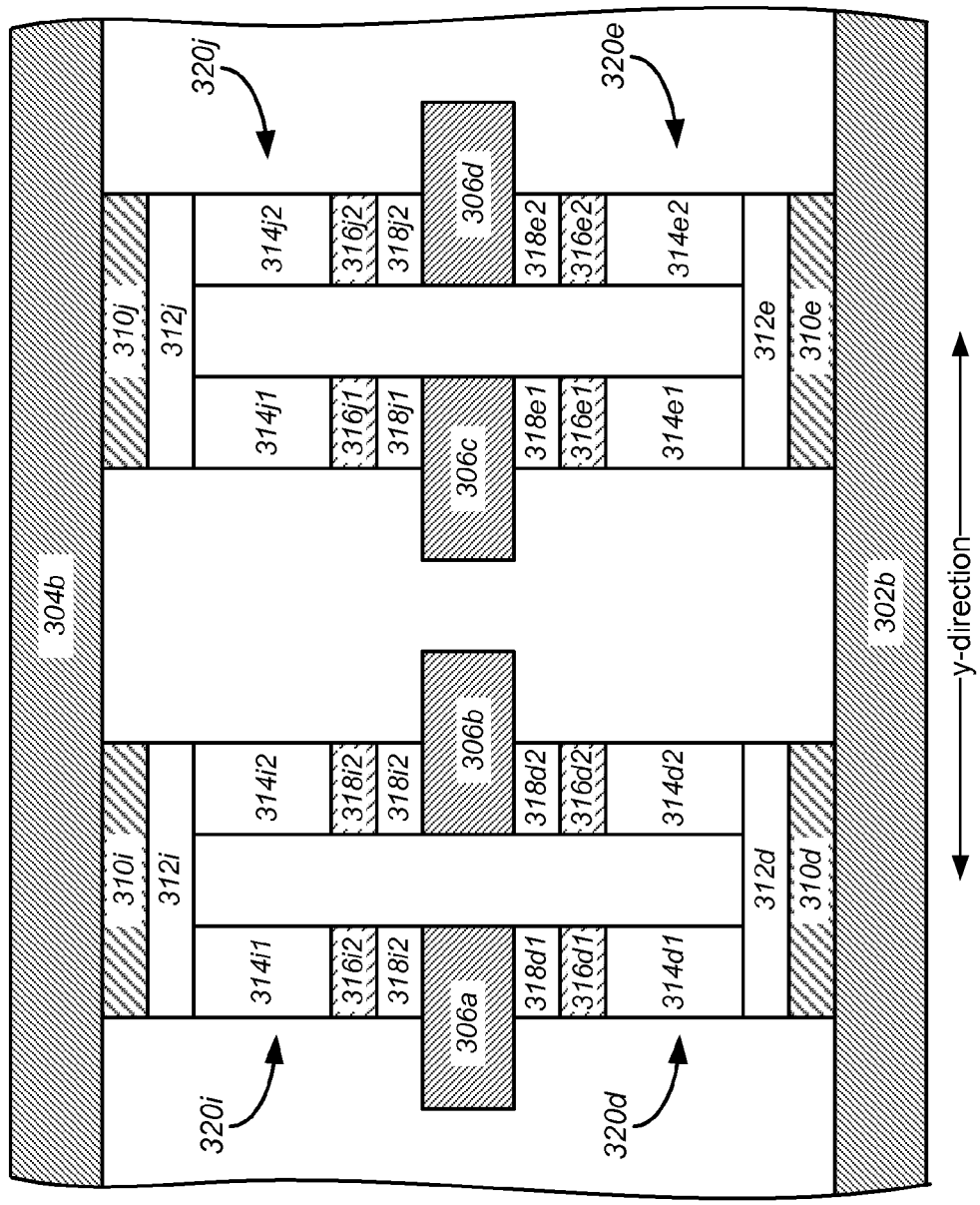

THREE-DIMENSIONAL MEMORY STRUCTURES HAVING SHARED PILLAR MEMORY CELLS

BACKGROUND OF THE INVENTION

1. Field of the Invention

Embodiments in accordance with the present disclosure are directed to integrated circuits containing non-volatile memory cell arrays and particularly those arrays incorporating passive element memory cells.

2. Description of the Related Art

Materials having a detectable level of change in state, such as a resistance or phase change, are used to form various types of non-volatile semiconductor based memory devices. For example, simple antifuses are used for binary data storage in one time field-programmable (OTP) memory arrays by assigning a lower resistance initial physical state of a memory cell to a first logical state such as logical '0,' and assigning a higher resistance physical state of the cell to a second logical state such as logical '1.' Some materials can have their resistance switched back in the direction of their initial resistance. These types of materials can be used to form re-writable memory cells. Multiple levels of detectable resistance in materials can further be used to form multi-state devices which may or may not be re-writable.

With reference to FIG. 1, materials having a memory effect such as a detectable level of resistance are often used as a state change element 102 which is placed in series with a steering element 104 to form a memory cell 100. Diodes or other devices having a non-linear conduction current are typically used as the steering element. In many implementations, a set of word lines and bit lines are arranged in a substantially perpendicular configuration with a memory cell at the intersection of each word line and bit line. In FIG. 1, conductor 110 may form a word line and conductor 112 may form a bit line or vice-versa. Two-terminal memory cells can be constructed at the intersections with one terminal (e.g., terminal portion of the cell or separate layer of the cell) in contact with the conductor forming the respective word line and another terminal in contactor with the conductor forming the respective bit line. Such cells are sometimes referred to as passive element memory cells.

Two-terminal memory cells with resistive state change elements have been used in three-dimensional field programmable non-volatile memory arrays because of their more simple design when compared to other three-terminal memory devices such as flash EEPROM. Three-dimensional non-volatile memory arrays are attractive because of their potential to greatly increase the number of memory cells that can be fabricated in a given wafer area. In monolithic three-dimensional memories, multiple levels of memory cells can be fabricated above a single substrate, without intervening substrate layers.

One type of three-dimensional memory utilizes a rail-stack structure to form the memory cells. A rail stack is formed by creating successive layers of material which are etched together to form an aligned stack of layers. A memory cell may be formed at the intersection of two such rail stacks. The fabrication of rail-stack structures generally requires fewer mask layers and processing steps to implement an array than other memory structures. The unintentional programming of unselected memory cells is possible in rail-stack structures, particularly with respect to memory cells adjacent to those currently selected. Exemplary memory arrays utilizing rail stacks are described in U.S. Pat. No. 6,631,085 and U.S. Pat. No. 7,022,572.

Another type of three-dimensional memory includes pillars of layers formed at the intersection of upper and lower conductors. Pillar based memory arrays are characterized by the separation of the various structures forming each memory cell from similar structures forming adjacent memory cells. FIGS. 2A-2B are perspective and cross-sectional views, respectively, of a portion of a traditional monolithic three-dimensional memory array. Both the word line and bit line layers are shared between memory cells forming what is often referred to as a fully mirrored structure. A plurality of substantially parallel and coplanar conductors form a first set of bit lines 162 at a first memory level L0. Memory cells 152 at level L0 are formed between these bit lines and adjacent word lines 164. In the arrangement of FIGS. 2A-2B, word lines 164 are shared between memory layers L0 and L1 and thus, further connect to memory cells 170 at memory level L1. A third set of conductors form the bit lines 174 for these cells at level L1. These bit lines 174 are in turn shared between memory levels L1 and memory level L2, depicted in the cross-sectional view of FIG. 2B. Memory cells 178 are connected to bit lines 174 and word lines 176 to form the third memory level L2, memory cells 182 are connected to word lines 176 and bit lines 180 to form the fourth memory level L3, and memory cells 186 are connected to bit lines 180 and word lines 184 to form the fifth memory level L5.

FIG. 2C is a cross-sectional view showing the materials used in forming one type of suitable memory cell for the structure of FIGS. 2A-2B. Memory cell 152 is formed in a pillar between bit line conductor 162 and word line conductor 164. The memory cell includes a p-i-n type diode steering element 102 having a heavily doped n-type region 122, intrinsic region 124, and a heavily doped p-type region 126. Between doped p-type region 126 and conductor 110 is a state change element 104. As just described, an antifuse state change element or a re-writable material having two or more detectable levels of resistance may be used. Other types of diodes such as p-n junction diodes can also be used.

The formation of pillar structures typically requires precise alignment in forming the small feature sizes of the structures. Numerous lithographical processes may be needed to define the pillar structures forming the individual memory cells. Exemplary memory arrays including pillar-based memory cells are described in U.S. Pat. Nos. 5,835,396 and 6,034,882, each of which is incorporated by reference herein in its entirety.

There remains a need for improved three-dimensional pillar designs and corresponding fabrication processes for forming the same in non-volatile memory array technologies.

SUMMARY OF THE INVENTION

A three-dimensional non-volatile memory system is disclosed including a memory array utilizing shared pillar structures for memory cell formation. A shared pillar structure includes two non-volatile storage elements. A first end surface of each pillar contacts one array line from a first set of array lines and a second end surface of each pillar contacts two array lines from a second set of array lines that is vertically separated from the first set of array lines. Each pillar includes a first subset of layers that are divided into portions for the individual storage elements in the pillar. Each pillar includes a second subset of layers that is shared between both non-volatile storage elements formed in the pillar. The individual storage elements each include a steering element and a state change element.

A non-volatile memory is provided in one embodiment that includes a first set of array lines elongated in a first direction and a second set of array lines elongated in a second direction substantially orthogonal to the first direction. The second set of array lines are vertically separated from the first set of array lines. A set of pillars in communication with the first set of array lines and the second set of array lines is provided. Each pillar of the set of pillars includes a first end surface and a second end surface. The first end surface connects to one array line of the first set of array lines and the second end surface connects to two array lines of the second set of array lines. Each pillar includes a first non-volatile storage element having a state change element and a steering element and a second non-volatile storage element having a state change element and a steering element.

In another embodiment, a non-volatile memory includes a first set of conductors elongated in a first direction and a second set of conductors elongated in a second direction substantially orthogonal to the first direction. The second set of conductors is vertically separated from the first set of conductors. A first pillar is provided that has a first end surface in contact with a first conductor of the first set of conductors and a second end surface in contact with a first conductor of the second set of conductors and a second conductor of the second set of conductors. A first diode is formed in the first pillar having a first electrode terminating at the first end surface and a second electrode separated from the first electrode by at least a first semiconductor region. A second diode formed in the first pillar shares the first electrode with the first diode and has a third electrode separated from the first electrode by at least the first semiconductor region.

A method of making non-volatile memory is provided in accordance with one embodiment includes forming a first conductor layer, a first diode layer, a second diode layer, a third diode layer, and a state change layer. The first conductor layer, the first diode layer, the second diode layer, the third diode layer, and the state change layer are etched into a first set of strips elongated in a first direction with spaces therebetween in a second direction. Etching the first conductor layer includes forming a first set of conductors. A first pattern is formed over each strip with the pattern covering first portions of each strip with uncovered portions of each strip between adjacent first portions in the first direction. The first diode layer, the second diode layer, the third diode layer, and the state change layer of each strip are etched at the uncovered portions according to the first pattern to form a set of pillars. Etching the first diode layer forms a first electrode in each pillar. A second conductor layer is formed over the set of pillars followed by forming a second pattern over the second conductor layer. The second pattern includes strips elongated in the second direction with spaces therebetween in the first direction. The second conductor layer is etched according to the second pattern to form a second set of conductors elongated in the second direction with spaces therebetween in the first direction. The state change layer of each pillar is etched according to the second pattern to form a first state change element and a second state change element in each pillar. The third diode layer of each pillar is etched according to the second pattern to form a second electrode and a third electrode in each pillar. Each pillar includes a first diode and a second diode. The first diode in each pillar is formed from the first electrode and the second electrode. The first electrode and the second electrode are separated by the second diode layer. The second diode in each pillar shares the first electrode with the first diode in the same pillar and includes the third electrode. The first electrode and the third electrode are separated by the second diode layer.

Other features, aspects, and objects of the disclosed technology can be obtained from a review of the specification, the figures, and the claims.

BRIEF DESCRIPTION OF THE DRAWINGS

FIG. 7 is a cross-sectional view of a portion of a three-dimensional non-volatile memory using a mirrored architecture in accordance with one embodiment.

DETAILED DESCRIPTION

Figure 3:
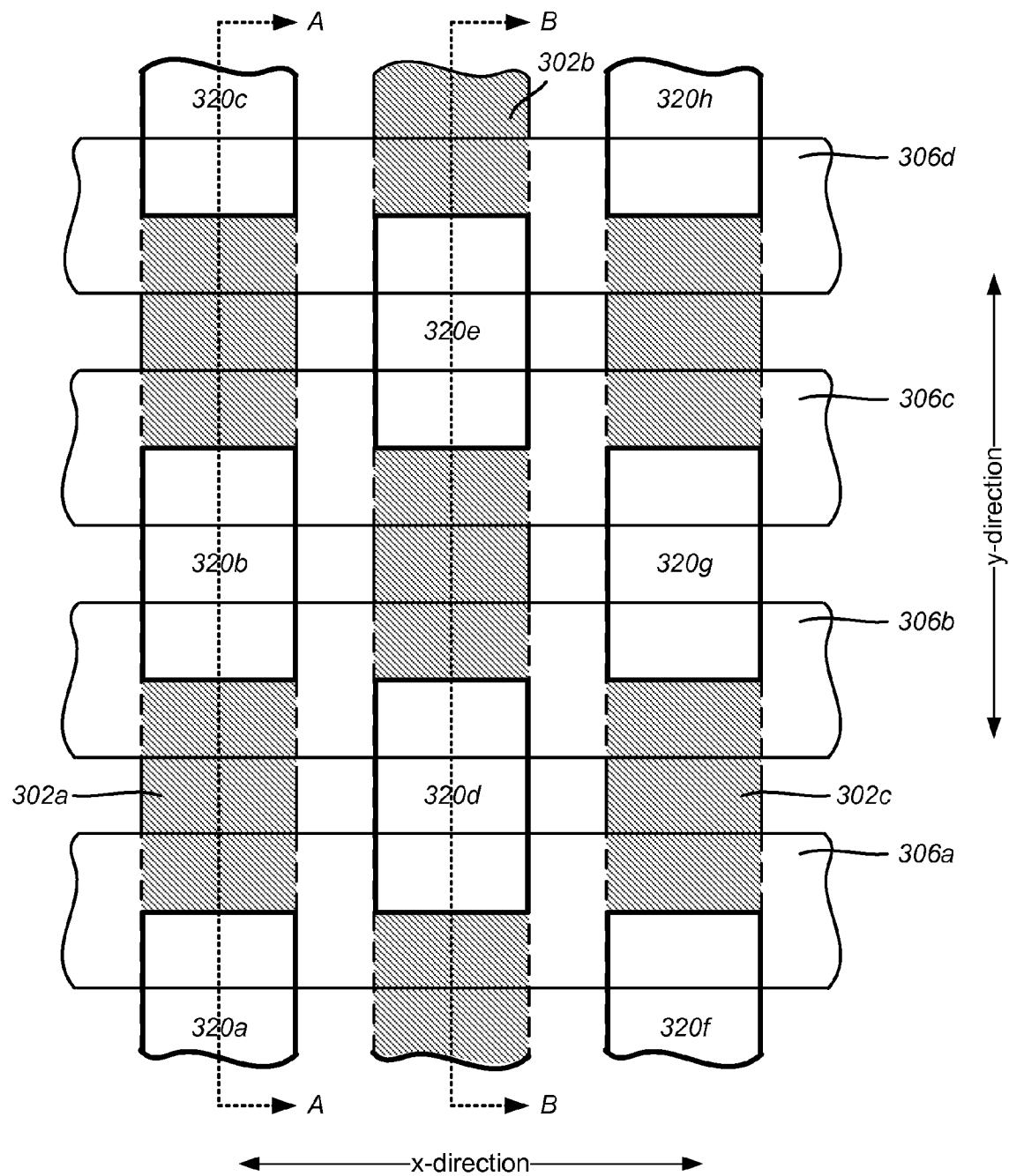
FIG. 3 is an overhead view depicting a portion of a three-dimensional non-volatile memory in accordance with one embodiment.
Figure 4:
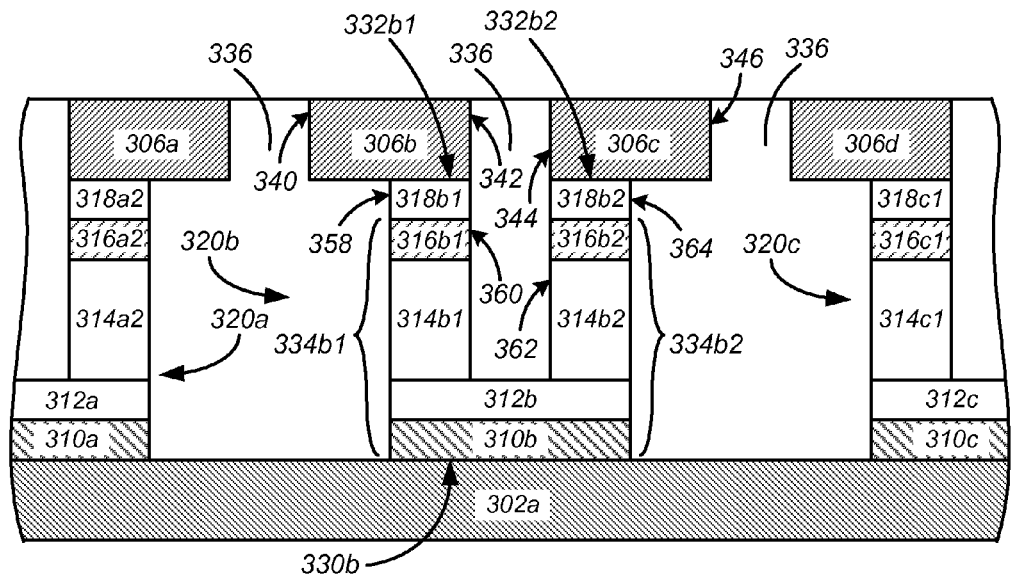
FIG. 4 is a cross-sectional view taken along line A-A in FIG. 3.

FIG. 3 is an overhead depiction of a portion of one memory level in a monolithic three-dimensional non-volatile memory array in accordance with one embodiment of the presently disclosed technology. A first set of array lines includes conductors 302a, 302b 302c elongated over a substrate (not shown) in a y-direction with spaces therebetween in an x-direction. A second set of array lines includes conductors 306a, 306b, 306c and 306d elongated over the substrate in the x-direction with spaces therebetween in the y-direction. Although only a few array lines are depicted in FIG. 4, any number of array lines may be included in a given embodiment. For example, many implementations will include thousands of bit lines and word lines. The second set of array lines is vertically separated from the first set of array lines, overlying the first set of array lines in a substantially orthogonal direction. The second set of array lines is depicted transparently to illustrate the underlying features. Note that vertical refers to a direction perpendicular to the surface of the substrate over which the features are formed. The array lines are vertically separated in the direction perpendicular to the substrate surface. The array lines at one layer may be termed word lines or x-lines. The array lines at a vertically adjacent layer may be termed bit lines or y-lines. Reference may be made to the first set of array lines as bit lines and the second set of array lines as word lines for convenience. Such designation is exemplary as the first set of array lines may alternatively form word lines and the second set of array lines may alternatively form bit lines in different embodiments.

A set of vertically-oriented shared pillars 320a-320h is formed between the first set of array lines and the second set of array lines. Each pillar is in communication with one array line from the first set of array lines and two array lines from the second set of array lines. A first terminal portion of each pillar connects to the array line from the first set and a second terminal portion connects to both array lines from the second set. These pillars are referred to as shared pillars because each pillar includes or is shared by two non-volatile storage elements and is in communication with two of the array lines from the second set. Shared pillar 320d, for example, includes a first end surface contacting array line 302b of the first set of array lines and includes a second end surface contacting both array lines 306a and 306b of the second set of array lines. Note that the spacing between adjacent pillars on the same conductor of the first set of array lines is greater than the spacing between the conductors of the first set and the conductors of the second set. Different spacing can be used, for example, with all spacings equal or the pillar spacing less than the line spacing of the first set of array lines and/or the second set of array lines.

Two memory cells are formed within each of the shared pillar structures. A first subset of the layers forming the layer stack of each pillar is divided into electrically isolated portions. A second subset of the layers is not divided and extends continuously in the y-direction along the full width of the pillar in that direction. In this discussion "width" or "length" refers to the width or length of a line or feature measured in the plane substantially parallel to the substrate. The term thickness refers to vertical thickness, measured in a direction perpendicular to the substrate on which the layers are formed. A first memory cell is formed from one electrically isolated portion of the divided first subset of layers and the undivided second subset of layers. A second memory cell is formed from the other electrically isolated portion of the divided first subset of layers and the undivided second subset of layers. The second subset of layers is shared between the two memory cells.

With reference to shared pillar 320b, for example, a first portion of the pillar underlies conductor 306b and a second portion of the pillar underlies conductor 306c. A third portion of the pillar does not underlie any conductor from the second set of array lines. A first subset of layers in the layer stack of pillar 320b is divided into a first portion that underlies conductor 306b and a second portion that underlies conductor 306c. The first portion of the first subset of layers and an undivided second subset of layers in the pillar forms a first memory cell that is addressable by conductor 302a and conductor 306b. A second portion of the first subset of layers and an undivided second subset of layers in the pillar forms a second memory cell that is addressable by conductor 302a and conductor 306c. Conductor 306b also overlies a second portion of pillar 320d and a first portion of pillar 320g. Memory cells formed from a portion of a divided first subset of layers and an undivided second subset of layers in each of these pillars are addressable by conductor 306b and conductor 302b (pillar 320d) or conductor 306b and conductor 302c (pillar 320g). Conductor 306c also overlies a first portion of pillar 320e and a second portion of pillar 320g. Memory cells formed from a portion of a divided first subset of layers and an undivided second subset of layers in each of these pillars are addressable by conductor 306c and conductor 302b (pillar 320c) or conductor 306c and conductor 302c (pillar 320g). Conductor 306a overlies a second portion of pillar 320a, a first portion of pillar 320d and a second portion of pillar 320f. Memory cells formed from a portion of a divided first subset of layers and an undivided second subset of layers in each of these pillars are addressable by conductor 306b and their respective conductor from the first set of array lines. Conductor 306d overlies a first portion of pillar 320c, a second portion of pillar 320c and a first portion of pillar 320h. Memory cells formed from a portion of a divided first subset of layers and an undivided second subset of layers in each of these pillars are addressable by conductor 306b and their respective conductor from the first set of array lines.

In FIG. 3, the pillar structures have a rectangular shape as viewed from above. In other embodiments, the pillar structures may have different shapes. For example, the pillars are substantially cylindrical in one embodiment. It is also noted that rectangular features formed with features sizes at certain dimensions (e.g., less than 2500 A in both dimension) using standard photomasking techniques tend to be substantially cylindrical regardless of the shape of the mask. The semiconductor elements after etch may thus be substantially cylindrical, with a diameter ranging from about 300 to about 2500 A in one exemplary embodiment.

Figure 6:
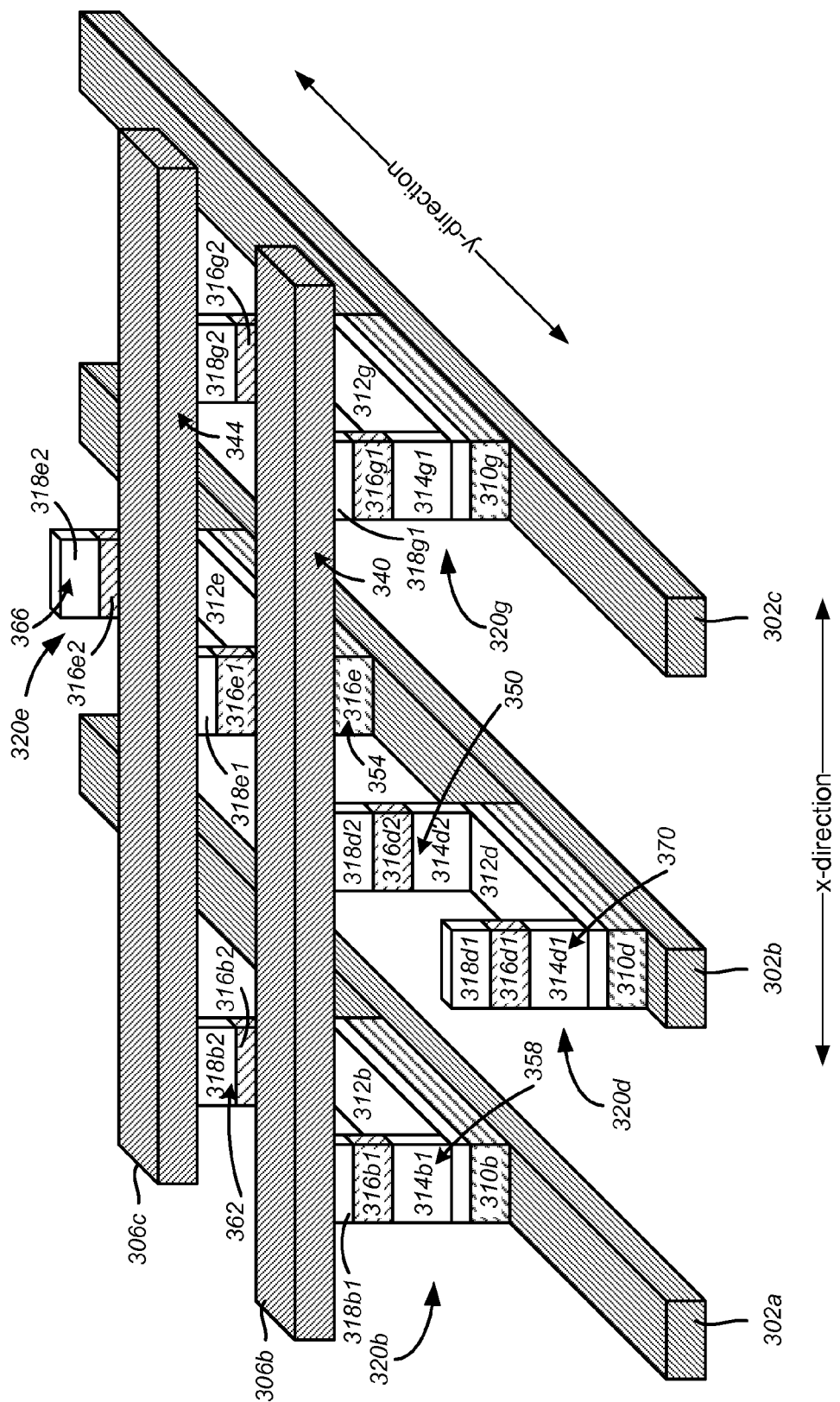
FIG. 6 is a perspective view of the portion of the non-volatile memory depicted in FIG. 3.

FIG. 4 is a cross-sectional depiction of the memory array in FIG. 3 taken along line A-A in the y-direction through conductor 302a. FIG. 6 is a corresponding perspective view of the memory array in FIG. 3, with array lines 306b, 306c, shared pillars 320a, 320c, 320f, 320h and the insulating dielectric regions purposively omitted to better illustrate the particular features described hereinafter. Each of the views is not necessarily to scale. Shared pillar 320b is formed from a vertical layer stack between conductor 302a at a first height above the substrate (not shown) and conductors 306b and 306c at a second height above the substrate. Pillar 320b includes a first vertical end surface 330b in continuous contact with conductor 302a along its width in the x-direction as shown in FIG. 3. Pillar 320b includes a second vertical end surface having a first portion 332b1 in contact with conductor 306b and a second portion 332b2 in contact with conductor 306c. A first subset of the layers in the layer stack is divided into individual portions under the different portions of the second end surface. Layers 318b1, 316b1 and 314b1 underlie the first portion 332b1 of the second end surface and layers 318b2, 316b2 and 314b2 underlie the second portion 332b2 of the second end surface. Layers 318b1, 316b1 and 314b1 extend in the y-direction between substantially vertical sidewalls 358 and 360 which face the y-direction and extend in the x-direction. Layers 318b2, 316b2 and 314b2 extend in the y-direction between sidewalls 362 and 364, facing the y-direction and extending in the x-direction. A dielectric region 336 separates layers 318b1, 316b1 and 314b1 from layers 318b2, 316b2 and 314b2 in the y-direction, providing electrical isolation therebetween. Layers 312b and 310b are not divided within the pillar, extending continuously between sidewalls 358 and 364.

A first non-volatile storage element is formed in shared pillar 320b from layers 318b1, 316b1, 314b1, 312b and 310b and a second non-volatile storage element is formed from layers 318b2, 316b2, 314b2, 312b and 310b. The first storage element includes a state change element formed from layer 318b1 in series with a diode switching element 334b1 formed from layers 316b1, 314b1, 312b and 310b. Diode 334b1 includes a first electrode formed from layer 310b and second electrode formed from layer 316b1. The first and second electrodes are separated by intrinsic regions formed from layers 312b and 314b1. The second non-volatile storage element includes a state change element formed from layer 318b2 in series with a diode switching element 334b2 formed from layers 316b2, 314b2, 312b and 310b. Diode 334b2 shares first electrode 310b and intrinsic region 312b with diode 334b1 and further includes a second electrode formed from layer 316b2 and an additional intrinsic region 314b2.

The state change elements formed in each pillar (e.g., state change elements 318b1 and 318b2) can vary by embodiment and include different types of materials to store data through representative physical states. The state change elements can include resistance change materials, phase change resistive materials, etc. A semiconductor or other material having two or more detectable levels resistance can be used to form a passive storage element. The state change elements can include materials capable of a single resistance change to form a one-time programmable memory or materials capable of reversible resistance changes to form a re-writable memory. A range of resistance values can be assigned to a physical data state to accommodate differences amongst devices as well as variations within devices after set and reset cycling. The terms set and reset are typically used, respectively, to refer to the process of changing an element from a high resistance physical state to a low resistance physical state (set) and changing an element from a low resistance physical state to a higher resistance physical state (reset).

A variety of materials exhibit resistivity change behavior suitable for implementing the state change elements. Examples include, but are not limited to, doped semiconductors (e.g., polycrystalline silicon, more commonly polysilicon), transition metal oxides, complex metal oxides, programmable metallization connections, phase change resistive elements, organic material variable resistors, carbon polymer films, doped chalcogenide glass, and Schottky barrier diodes containing mobile atoms that change resistance. State change elements formed from carbon can include any combination of amorphous and graphitic carbon. In one aspect, the carbon is deposited as a carbon film. However, it is not required that a carbon state change element be a carbon film. In one aspect, the state change element can include a carbon nanotube. One type of carbon nanotube stores a charge based on position of a "guest" molecule in the nanotube. The position of the guest molecule, which remains stable even without energy supplied to the memory cell, modifies the electric properties of the nanotube. One stable position of the guest molecule results in a high current, whereas the current is measurably lower in at least one other position. In one embodiment, the state change element 104 is $Ge_2Sb_2Te_5$ (GST). GST has a property of reversible phase change from crystalline to amorphous-allowing two levels per cell. However, quasi-amorphous and quasi-crystalline phases may also be used to allow additional levels per cell with GST. The resistivity of the aforementioned materials in some cases may only be set in a first direction (e.g., high to low), while in others, the resistivity may be set from a first level (e.g., higher resistance) to a second level (e.g., lower resistance), and then reset back to the first resistivity level. As a discreet device or element may have a resistance and different resistance states, the terms resistivity and resistivity state are used to refer to the properties of materials themselves. Thus, while a resistance change element or device may have resistance states, a resistivity change material may have resistivity states.

In one embodiment, state change elements 318b1, 318b2 are antifuses. An antifuse is manufactured in a high resistance state and can be popped or fused to a lower resistance state. An antifuse is typically non-conductive in its initial state and exhibits high conductivity with low resistance in its popped or fused state. Various types of antifuses can be used, including but not limited to dielectric rupture antifuses, intrinsic or lightly doped polycrystalline semiconductor antifuses and amorphous semiconductor antifuses, for example. In addition to its data storage ability, an antifuse can serve to set the on-resistance of the memory cell in at an appropriate level relative to the read-write circuitry associated with the cell. These circuits are typically used to pop the antifuse and have an associated resistance. Because these circuits drive the voltages and current levels to pop the antifuse, the antifuse tends to set the memory cell in an appropriate on-resistance state for these same circuits during later operations.

In one embodiment the first electrode 310b shared by diodes 334b1 and 334b2 is heavily doped polysilicon having a p+ conductivity type and the second electrodes 316b1 and 316b2 are heavily doped polysilicon having an n+ conductivity type. The regions 312b, 314b1 and 314b2 are intrinsic or not intentionally doped polysilicon in one embodiment. Note that intrinsic regions 312b1, 314b1 and 314b2 may be lightly doped in some embodiments, for example, having a dopant concentration less than $1\times10^{18}/cm^3$. Undoped regions may not be perfectly electrically neutral, resulting from defects, contaminants, etc. that may cause it to behave as if slightly n-doped or p-doped. Such lightly doped regions are still considered intrinsic. The arrangement of the diodes' polarity and the respective arrangement of the word lines and bit lines can vary by implementation. For example, first electrode 310b can be formed of an n+ type material with the second electrodes 316b1 and 316b2 formed of a p+ type material in one embodiment. In such an example, the bit lines and word lines may be switched in their relative functions along with the memory decoders and read/write circuitry if necessary.

Conductor 306b overlies the first portion 332b1 of the second end surface of shared pillar 320b between sidewalls 358 and 360 of the pillar. Conductor 306b spans a width in the y-direction defined by substantially vertical sidewalls 340 and 342. In this example, the width of conductor 306b is substantially larger than the width of underlying layers 318b1, 316b1 and 314b1 between sidewalls 358 and 360. The conductor's length in the y-direction is approximately twice that of layers 318b1, 316b1 and 314b1. The width of the conductor can be substantially equal to that of the underlying layers in other embodiments as described hereinafter. Sidewall 342 of conductor 306b is self-aligned with sidewall 360 of layers 318b1, 316b1 and 314b1, the two sidewalls being defined in a single etch process. Conductor 306c overlies the second portion 332b2 of the second end surface of shared pillar 320b between sidewalls 362 and 364. As with all conductors of the second set, conductor 306c spans a width in the y-direction defined by substantially vertical sidewalls 344 and 346 that is substantially larger than the width of its underlying layers 318b2, 316b2 and 314b2. Sidewall 344 of conductor 306c is self-aligned with sidewall 362 of layers 318b2, 316b2 and 314b2, the two sidewalls being defined by a single etch process.

Figure 5:
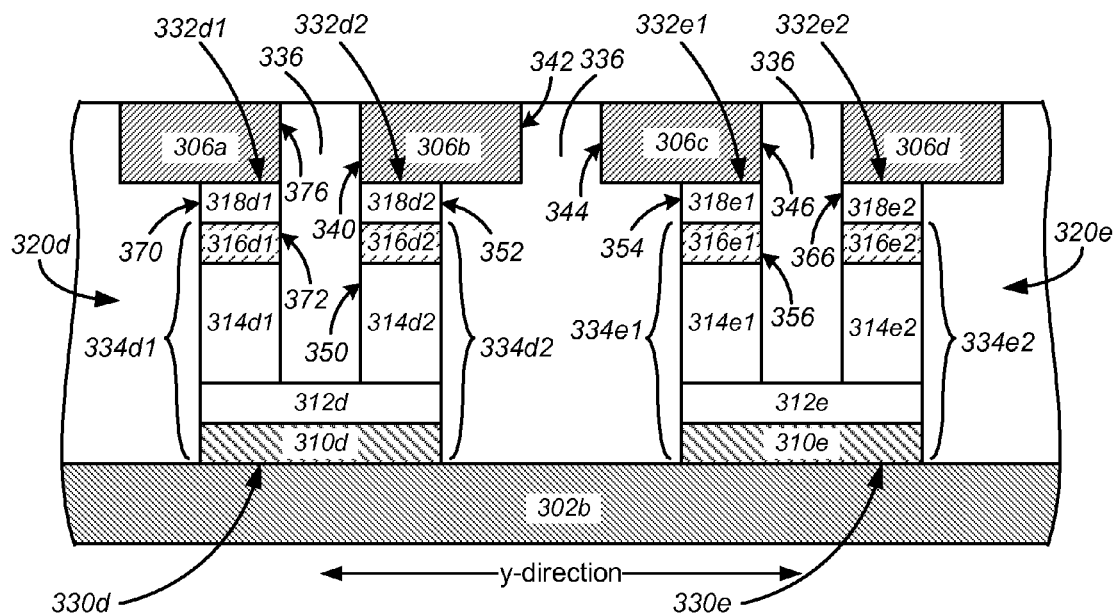
FIG. 5 is a cross-sectional view taken along line B-B in FIG. 3.

FIG. 5 is a cross-sectional depiction of the memory array in FIG. 3 taken along line B-B in the y-direction through conductor 302b, depicting shared pillars 320d and 320e in more detail. Pillar 320d includes a first vertical end surface 330d in continuous contact with conductor 302b and a second vertical end surface having a first portion 332d1 in contact with conductor 306a and a second portion 332d2 in contact with conductor 306b. Pillar 320e includes a first vertical end surface 330e in continuous contact with conductor 302b and a second vertical end surface having a first portion 332e1 in contact with conductor 306c and a second portion 332e2 in contact with conductor 306d.

Each of the pillar structures in FIG. 5 is formed as described with respect to pillar 320b FIG. 4. A first storage element in pillar 320d includes a state change element formed from layer 318d1 in series with a diode switching element 334d1. Diode 334d1 includes a first electrode layer 310d and second electrode layer 316*d*1 separated by intrinsic regions 314*d*1 and 312*d*. The second non-volatile storage element includes a state change element formed from layer 318*d*2 in series with a diode switching element 334*d*2. Diode 334*d*2 shares the first electrode layer 310*d* and intrinsic region 312*d* with diode 334*d*1. Diode 334*d*2 further includes a second electrode layer 316*d*2 and intrinsic region 314*d*2. A first storage element in pillar 320*e* includes a state change element formed from layer 318*e*1 in series with a diode switching element 334*e*1. Diode 334*e*1 includes a first electrode layer 310*e* and second electrode layer 316*e*1 separated by intrinsic regions 314*e*1 and 312*e*. The second non-volatile storage element includes a state change element formed from layer 318*e*2 in series with a diode switching element 334*e*2. Diode 334*e*2 shares the first electrode layer 310*e* and intrinsic region 312*e* with the first storage element. Diode 334*e*2 further includes a second electrode layer 316*e*2 and intrinsic region 314*e*2.

Conductor 306*a* overlies the first portion 332*d*1 of the second end surface of shared pillar 320*d* between sidewalls 370 and 372. Conductor 306*b* overlies the second portion 332*d*2 of the second end surface of shared pillar 320*d* between sidewalls 350 and 352. Conductor 306*a* includes a substantially vertical sidewall 376 that is self-aligned with sidewall 372 of layers 318*d*1, 316*d*1, 314*d*1, the two sidewalls being defined in a single etch process. Sidewall 340 of conductor 306*b* is self-aligned with sidewall 350 of layers 318*d*2, 316*d*2 and 314*d*2, the two sidewalls being defined by a single etch process. Recall that sidewall 342 of conductor 306*b* is self-aligned with sidewall 360 of shared pillar 320*b* on adjacent conductor 302*a* from the first set of array lines. Shared pillar 320*b* has an external sidewall 358 facing opposite the external sidewall 352 of pillar 320*d* in the y-direction. External sidewall 358 of pillar 320*b* is substantially aligned in the y-direction with external sidewall 352 of pillar 320*d*. In this manner, overlying conductor 306*b* will have its sidewalls aligned with the internal sidewalls 350 and 360 of the pillar structures on adjacent conductors from the first set of array lines.

Conductor 306*c* is formed in similar relation with respect to pillars 320*b* and 320*e*. Conductor 306*c* overlies the first portion 332*e*1 of the second end surface of shared pillar 320*c* between sidewalls 354 and 356. Sidewall 346 of conductor 306*c* is self-aligned with sidewall 356 of layers 318*e*1, 316*e*1 and 314*e*1, the two sidewalls being defined by a single etch process. Recall that sidewall 344 of conductor 306*c* is self-aligned with sidewall 362 of shared pillar 320*b* on adjacent conductor 302*a*. Shared pillar 320*b* has an external sidewall 364 facing opposite the external sidewall 354 of pillar 320*d* in the y-direction. External sidewall 364 of pillar 320*b* is substantially aligned in the y-direction with external sidewall 354 of pillar 320*c*.

Several variations of the pillar structures described in FIGS. 3-6 are possible. In one embodiment, the shared pillar (e.g., 320*d*) does not include a shared intrinsic region (e.g., 312*d*). For instance, intrinsic region 314*d*1 of diode 334*d*1 can be made to extend from the overlying second electrode 316*d*1 to the first electrode 310*d*. Similarly, intrinsic region 314*d*2 of diode 334*d*2 can be made to extend from the overlying third electrode 316*d*2 to the first electrode 310*d*. Where a shared intrinsic region like 312*d* is utilized, the relative thickness of the shared intrinsic region to the overall pillar height can vary. In one example, the shared intrinsic region 312*d* and first electrode 310*d* shared between the two diodes 334*d*1 and 334*d*2 are less than or equal to half of the overall thickness of the entire pillar including the thickness of layers 310*d*, 312*d*, 314*d*1 (314*d*2), 316*d*1 (316*d*2) and 318*d*1 (318*d*2). The thickness of the shared intrinsic region relative to the thickness of regions 314*d*1 and 314*d*2 can also vary. In one example, they are equal. One can also be thicker than the other. It is noted that the thickness of the intrinsic regions that are not shared should be thick enough to avoid unintended programming of an unselected storage element in the same pillar.

In another variation, the state change elements 318*d*1 and 318*d*2 can be formed in different locations within the pillar. In one embodiment for example, second electrode 316*d*1 is formed in contact with word line 306*a* and third electrode 316*d*2 is formed in contact with word line 306*b*. State change element 318*d*1 is then formed between the second electrode 316*d*1 and the intrinsic region 314*d*1. Likewise, state change element 318*d*2 is then formed between the third electrode 316*d*2 and intrinsic region 314*d*2.

FIG. 7 is cross-sectional view like that of FIG. 4, showing a mirrored three-dimensional structure using a shared pillar arrangement. Pillars 320*d* and 320*e* are formed between x-array line 302 and y-array lines 306*a*-306*d* at a first memory level. Although referred to as a first memory level, it is noted that this memory level may be formed over other memory levels. Pillars 320*i* and 320*j* are formed over the first memory level. Each of these pillars is formed upside-down relative to the layers in the pillars at the first memory level and shares y-array lines 306*a*-306*d* with the underlying memory level. Pillar 320*i* includes a second end surface having a first portion in contact with conductor 306*a* and second portion in contact with conductor 306*b*. A first end surface of pillar 320*i* connects to conductor 304*b* which is part of an additional set of x-array lines vertically separated from the first set of array lines. Pillar 320*j* includes a second end surface having a first portion in contact with conductor 306*c* and a second portion in contact with conductor 306*d*. A first end surface of pillar 320*j* connects to conductor 304*b*.

Within pillar 320*i*, a first memory cell includes a state change element 318*i*2 and a diode formed from a first electrode 310*i* and a second electrode 316*i*1, separated by intrinsic regions 312*i* and 314*i*1. A second memory cell includes a state change element 318*i*2 and a diode sharing first electrode 310*i* and having a second electrode 316*i*2, separated by intrinsic regions 312*i* and 314*i*2. Within pillar 320*j*, a first memory cell includes a state change element 318*j*1 and a diode formed from a first electrode 310*j* and a second electrode 316*i*1, separated by intrinsic regions 312*j* and 314*j*1. A second memory cell includes a state change element 318*j*2 and a diode sharing first electrode 310*j* and having a second electrode 316*j*2, separated by intrinsic regions 312*j* and 314*j*2.

Figure 1:
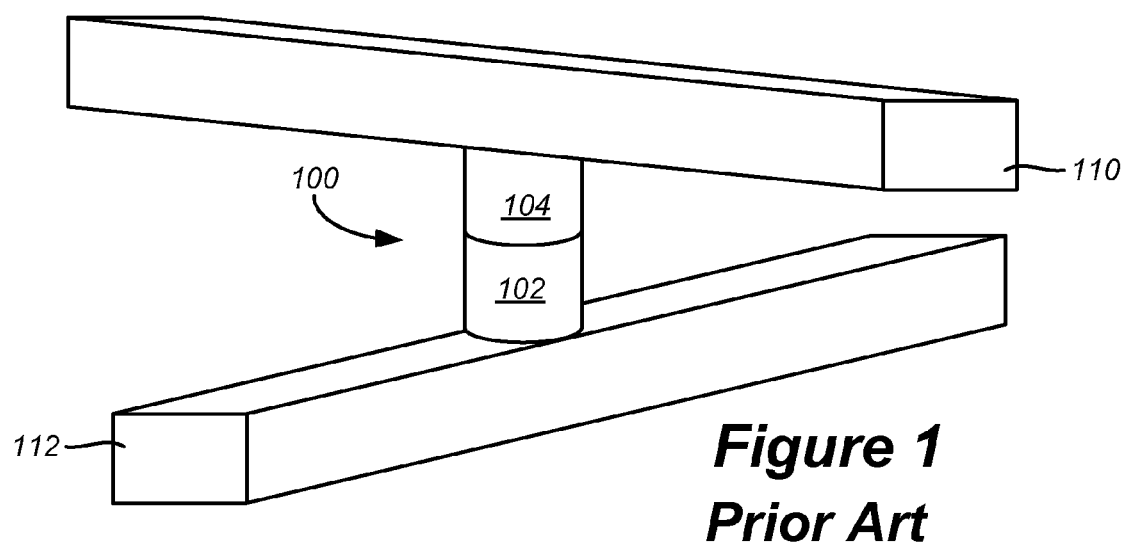
FIG. 1 depicts an exemplary two-terminal non-volatile memory cell having a steering element in series with a state change element.
Figure 2A:
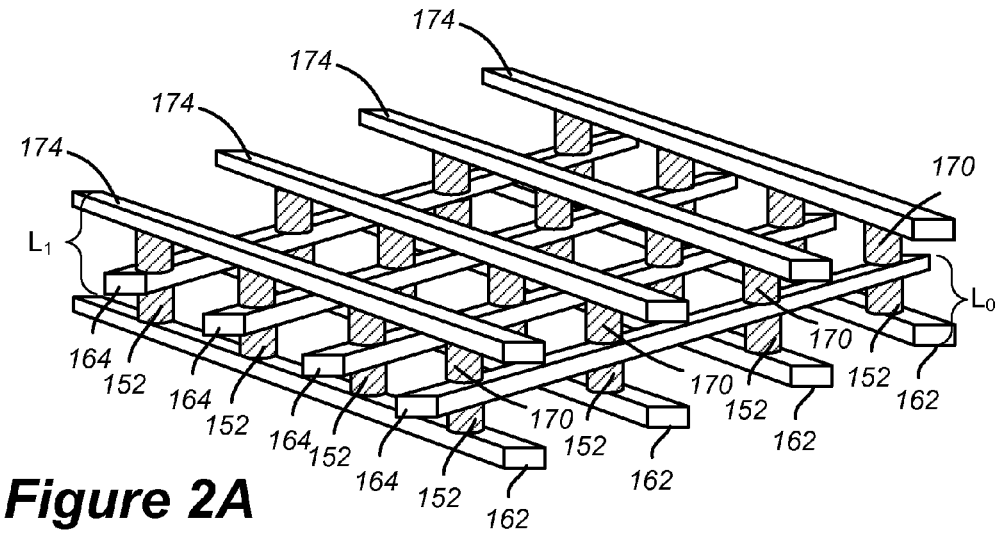
FIGS. 2A and 2B are respective perspective and cross-sectional views of a three-dimensional memory array.
Figure 2B:
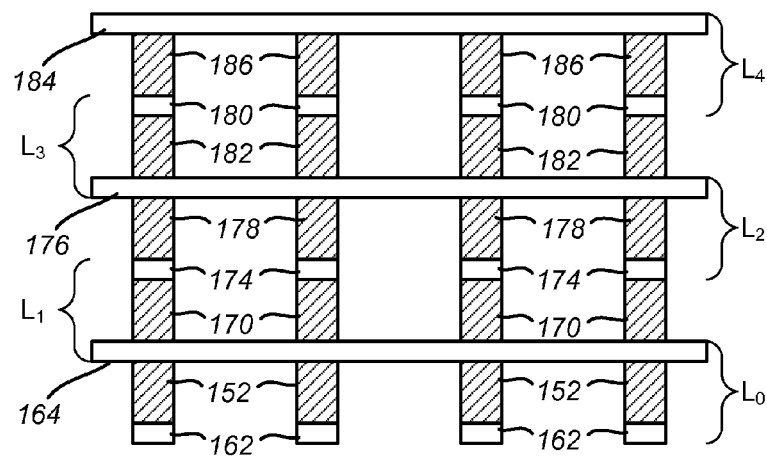
Figure 2C:
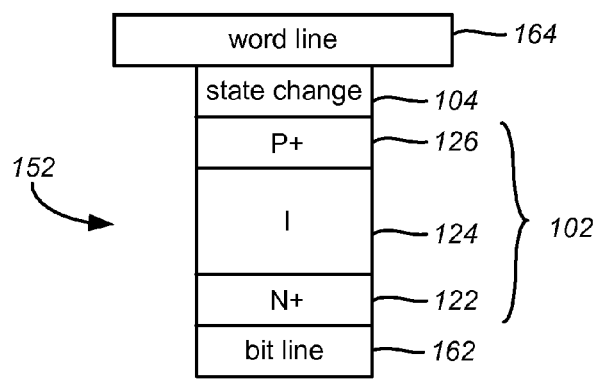
FIG. 2C is a cross-section view of one type of memory cell that may be used in the array of FIGS. 2A-2B.

The structure depicted in FIG. 7 is a mirrored structure. Array lines 306*a*-306*d* are shared by the overlying memory level including pillars 320*i* and 320*j* and the underlying memory level including pillars 320*d* and 320*e*. The x-array lines can also be shared, but need not be. For example, conductor 302*b* can be shared by pillars formed at a memory level below. The pillars can be arranged as described for pillars 320*i* and 320*j*. Similarly, conductor 304*b* can be shared by pillars formed at a memory level above, using pillar structures arranged as described for pillars 320*d* and 320*e*. This structure is referred to as fully-mirrored, with each type of array line being shared as described with respect to FIGS. 2A-2B. In an alternative embodiment, one type of array line can be shared while another type is not. For example, only the word lines or only the bit lines can be shared in some configurations. With reference to FIG. 7, an insulating layer can be formed over conductor 304*b* before forming another memory level in the same configuration as that depicted. This type of configuration is often referred to as half-mirrored. The x-array lines are shared between memory levels while the y-array lines are not. In another embodiment, an inter-level dielectric can be formed between adjacent memory levels such that no conductors are shared between memory levels. This type of structure for three-dimensional monolithic storage memory is often referred to as a non-mirrored structure. In some embodiments, adjacent memory levels that share conductors and adjacent memory levels that do not share conductors can be stacked in the same monolithic three dimensional memory array.

FIGS. 8A-8H schematically illustrate the fabrication of a portion of a monolithic three-dimensional memory array in accordance with one embodiment. Processing begins with a substrate 600, which may undergo initial processing to form transistors (e.g., CMOS) in the substrate for the peripheral circuitry. The substrate can be any semiconductor substrate, such as a monocrystalline silicon, IV-IV compounds, III-V compounds, II-VII compounds, etc. and include epitaxial or other semiconductor layers formed over the substrate. An insulating layer (not shown) is formed over the substrate surface, followed by planarization using chemical mechanical polishing, resist etchback planarization, or any of a number of other suitable planarization technologies.

A first conductor layer 602 is formed over the insulating layer, followed by a series of additional layers to form a layer stack 601. An optional adhesion layer (not shown) may be formed over the insulating layer to aid in the adhesion of the conductive material. Suitable adhesion materials include, but are not limited to, tantalum nitride, tungsten nitride, titanium tungsten, sputtered tungsten, titanium nitride or combinations of these materials. Conductor layer 602 can include any suitable conductive material, including but not limited to tantalum, titanium, tungsten, copper cobalt or alloys thereof. Any suitable process can be used to form the layers of the stack, such as chemical vapor deposition (CVD), physical vapor deposition (PVD) or atomic layer deposition (ALD). In one embodiment, layer 602 is a layer of tungsten deposited by CVD to a thickness of about 3000 A. Although not shown, an optional adhesion layer can be formed over layer 602 in one embodiment to aid in the adhesion of the subsequently formed semiconductor layers.

Layer 604 is a first semiconductor material layer. The semiconductor material of layer 604, as well as those of the other semiconductor layers described below, can be silicon, silicon-germanium, silicon-germanium-carbon, germanium, or other suitable IV-IV compounds, gallium arsenide, indium phosphide, or other suitable III-V compounds, zinc selinide, or other II-VII compounds, or a combination of these materials. Silicon is the most widely used semiconductor material so for simplicity, reference is frequently made herein to silicon, but it will be understood that other materials may be substituted. Layer 604 has a first conductivity type. For example, layer 604 can be a heavily-doped p+ type polysilicon layer having a thickness of about 200 A in one embodiment. By way of example, the heavily-doped p+ silicon layer can be doped at a concentration greater than $5 \times 10^{18}$ atoms/cm$^3$ in one embodiment. The p+ layer is doped at a concentration greater than $1 \times 10^{19}$ atoms/cm$^3$ in another embodiment, and at a concentration greater than $1 \times 10^{20}$ atoms/cm$^3$ in yet another embodiment. The silicon can be deposited and then doped, or can be doped in-situ. As will be described below, the conductivity type of the various layers can be modified in different implementations. For simplicity, layer 604 is referred to as a p+ layer hereinafter but in different embodiments, can be of a different conductivity type, e.g., n+ type polysilicon.

A layer 606 of intrinsic semiconductor material is formed over p+ layer 604. Layer 606 is an undoped intrinsic silicon material having a thickness of about 3000 A in one embodiment. It is noted that the intrinsic layer 606 may not be perfectly electrical neutral and thus, can include lightly doped silicon in various implementations. Reference to an intrinsic material is intended to include such materials. A layer 608 of silicon having a second conductivity type is formed over the layer 606 of intrinsic material. Layer 608 is a heavily doped n+ type polysilicon layer having a thickness of about 200 A in one embodiment. Layer 608 can be doped with n-type impurities at concentrations similar to the p-type concentrations used for layer 604. A layer 610 of state change material is formed over the layer 608 of n+ type polysilicon. In one embodiment, the state change material is deposited to a thickness of about 20 A-100 A. Other thicknesses can be used and may vary according to the type of material selected. In one example, the state change material is an antifuse layer formed of silicon dioxide or other suitable material. In another example, the state change material is a state change material capable layer of reversible resistance changes, such as chalcogenide or the other materials earlier described.

A first pattern is applied to the layer stack to form the first set of array lines from conductor layer 602 and to divide the remaining layer stack into strips self-aligned with the array lines. In one example, the pattern is formed of strips of photoresist applied using conventional photolithography techniques. The strips 612 are elongated in the y-direction (in/out of the page in the orientation of FIG. 8A) with spaces between strips that are adjacent in the x-direction. The x-direction is substantially perpendicular to the y-direction. Photomasking, spacer-assisted patterning or nano-imprint masking technologies can also be applied to form a pattern for the layer stack strips and conductor lines. In one embodiment, a hard mask of SiO2 or other suitable material can be formed over the layer stack with a bottom antireflective coating, followed by patterning.

Figure 8A:
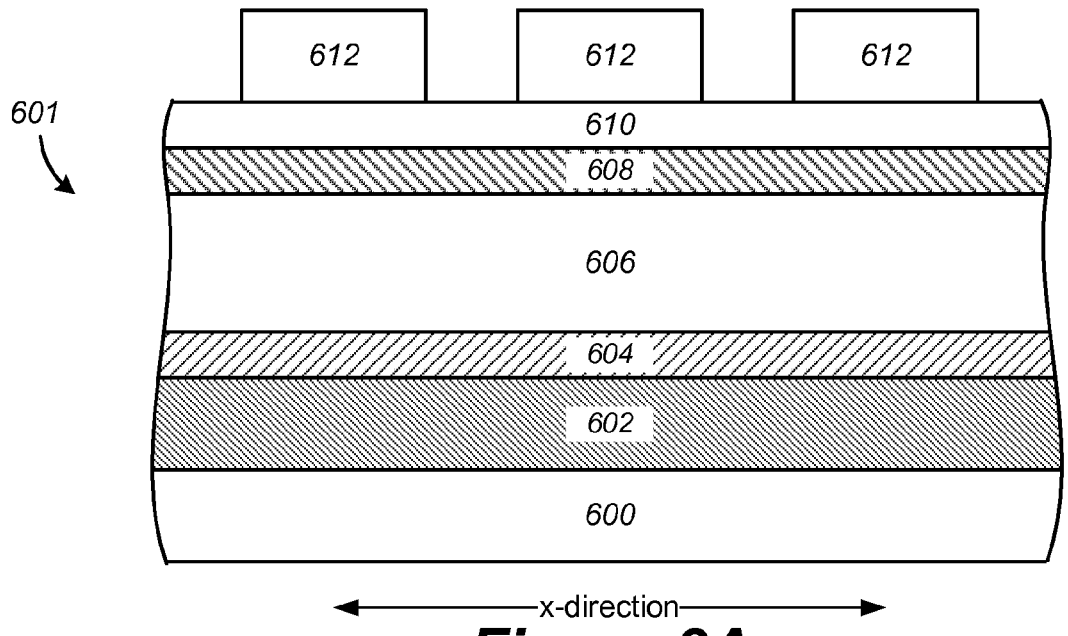
FIGS. 8A-8H are various cross-sectional and perspective views depicting the fabrication of a non-volatile memory array in accordance with one embodiment of the disclosed technology.
Figure 8B:
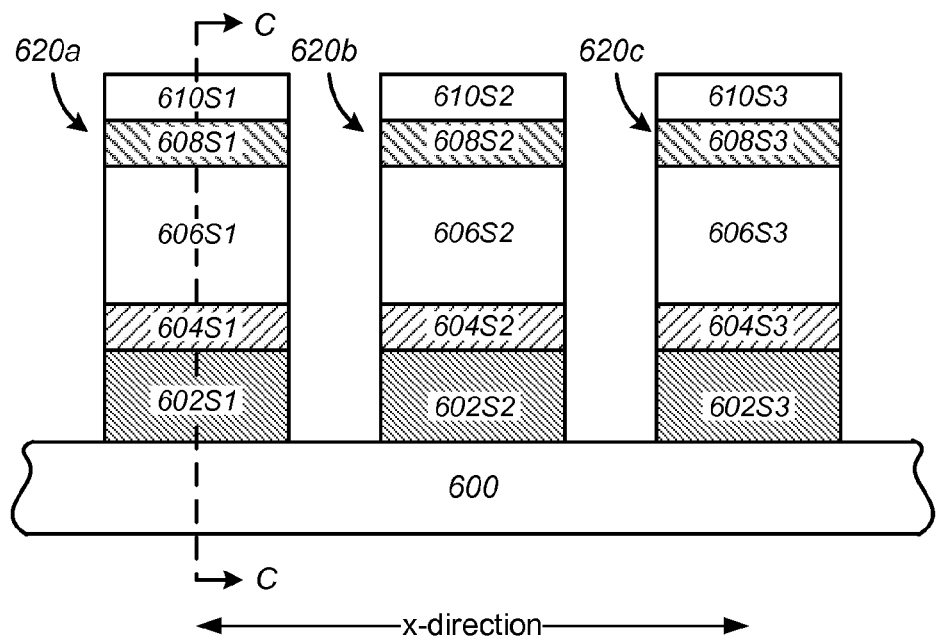

Using the photoresist as a mask, the layer stack is etched into strips shown in FIG. 8B. Etching proceeds until reaching the substrate. If an insulating layer is used, etching can proceed to the insulating layer. Any suitable etching process or processes can be used. Selective or non-selective etching can be used. In one example, anisotropic plasma etching (reactive ion etching with proper balance between physical and chemical etching for each planar layer) is used. Selective etch chemistries using etchants that will stop on the insulating layer can be used. Additionally, barrier materials that are not etched may also be used.

Etching forms strips 620a, 620b, and 620c elongated in the y-direction with spaces between strips that are adjacent in the second direction. The width of the strips in the x-direction may vary by embodiment, but in one example is about 450 A. Strip 620a includes a strip 602S1 of conductive layer 602, a strip 604S1 of p-type silicon layer 604, a strip 606S1 of intrinsic layer 606, a strip 608S1 of n-type silicon layer 608, and a strip 610S1 of state change material layer 610. Similarly, strip 620b includes a strip 602S2 of conductive layer 602, a strip 604S2 of p-type silicon layer 604, a strip 606S2 of intrinsic layer 606, a strip 608S2 of n-type silicon layer 610, and a strip 612S2 of state change material layer 612. Strip 620c includes a strip 602S3 of conductive layer 602, a strip 604S3 of p-type silicon layer 604, a strip 606S3 of intrinsic layer 606, a strip 608S3 of n-type silicon layer 610, and a strip 612S3 of state change material layer 612. After etching to form the strips, the photoresist and any hard mask layers are removed. The strips of photoresist can be removed using conventional processes such as ashing in an oxygen-containing plasma. Any hard mask layer can be removed using a chemical wet etch, for example. Although not shown in FIG. 9B, a dielectric material can be deposited to fill the spaces between strips and planarized to expose the upper portion of each strip before continuing.

Figure 8C:
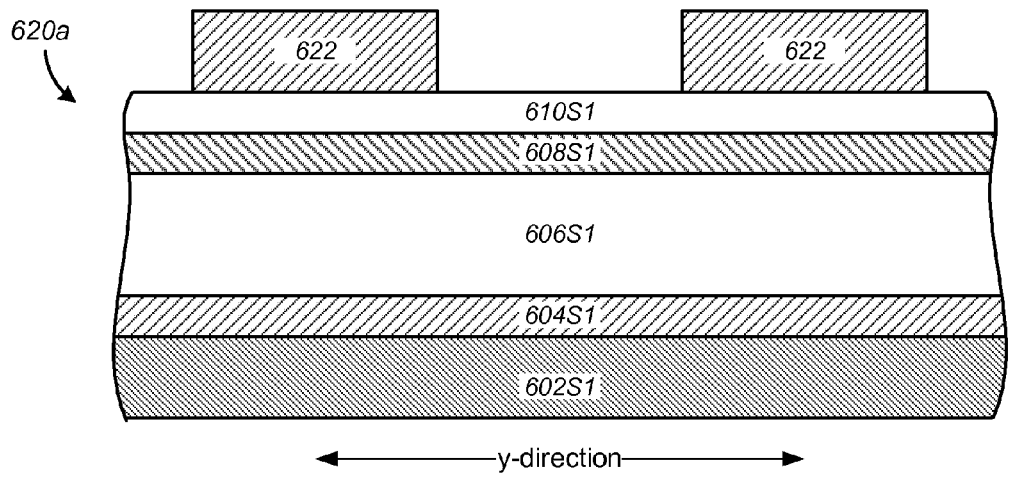
Figure 8D:
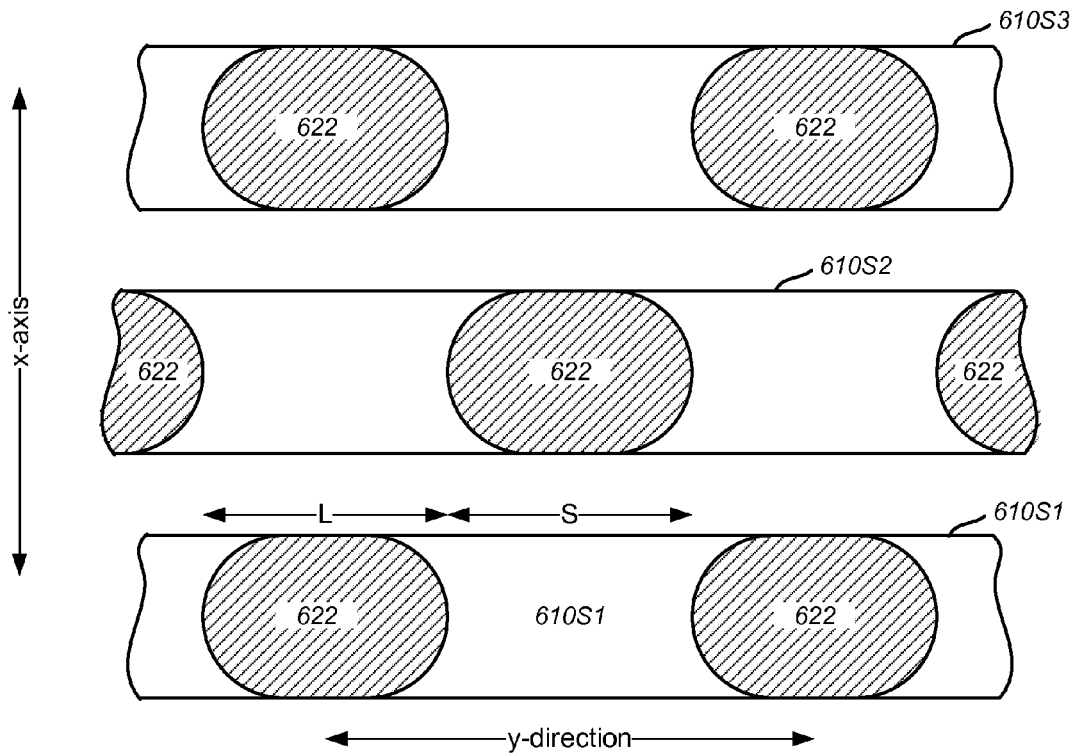

FIG. 8C is a cross-sectional view taken along line C-C of FIG. 8B through strip 620a, depicting the substrate 600 and layer stack strip 620a, including layers 602S1, 604S1, 606S1, 608S1, 610S1 and 612S1. FIG. 8D is a corresponding top-view of portion of the memory array at the same point in processing. A second pattern is applied over the layer stack strips for etching shared pillar structures from the individual strips. The second pattern includes individual photoresist portions 622 arranged in a checkerboard fashion over the array. These photoresist portions can be applied using traditional photomask patterning techniques in one embodiment. Additionally, hard masking, antireflective coating or other suitable masking techniques can be used to apply the depicted pattern. Although the mask in FIG. 8D uses cylindrical photoresist portions, rectangular or other shapes may be used as well.

In the described example, the individual photoresist portions are applied with equal line and space sizes across the length of each strip of the layer stack. For example, the space size S between photoresist portions 622 on strip 620a is equal to the dimension L of each portion in the y-direction. Each photoresist portion completely overlies its underlying strip in the x-direction between edges. Unequal line and space sizes can be used in other embodiments.

Figure 8E:
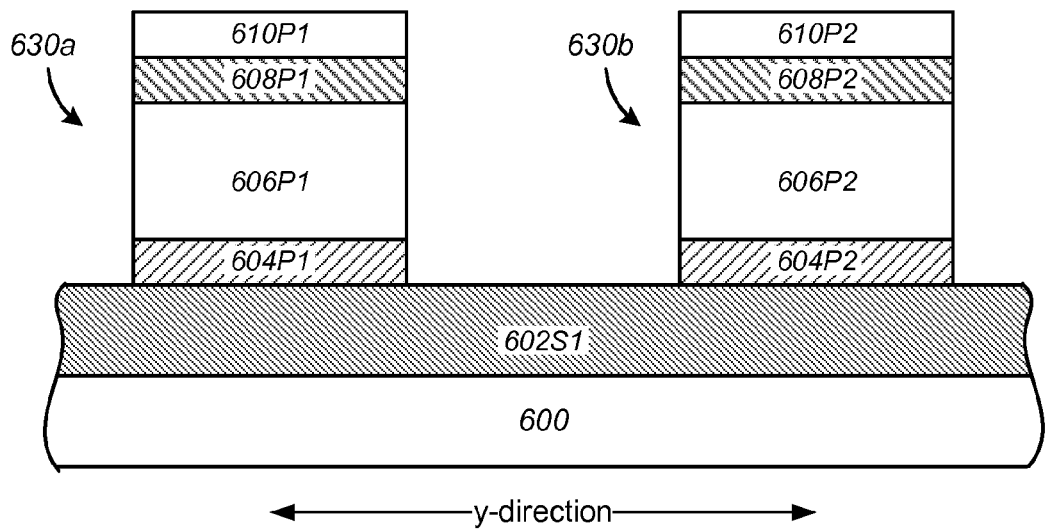

After applying the second pattern, the memory array is etched to form pillars shown in FIG. 8E. Etching proceeds until the first conductor layer 602 is reached so as not to etch through the array lines. In one embodiment, selective etching is used with etchants that stop on the conductive material. Etching layer stack strip 620a forms pillars 630a and 630b. Pillar 630a includes a portion 604P1 of p-type silicon strip 604S1, a portion 606P1 of intrinsic material strip 606S1, a portion 608P1 of n-type silicon strip 608S1 and a portion 610P1 of state change material strip 610S1. Pillar 630b includes a portion 604P2 of p-type silicon strip 604S2, a portion 606P2 of intrinsic material strip 606S2, a portion 608P2 of n-type silicon strip 608S2 and a portion 610P2 of state change material strip 610S1.

Figure 8F:
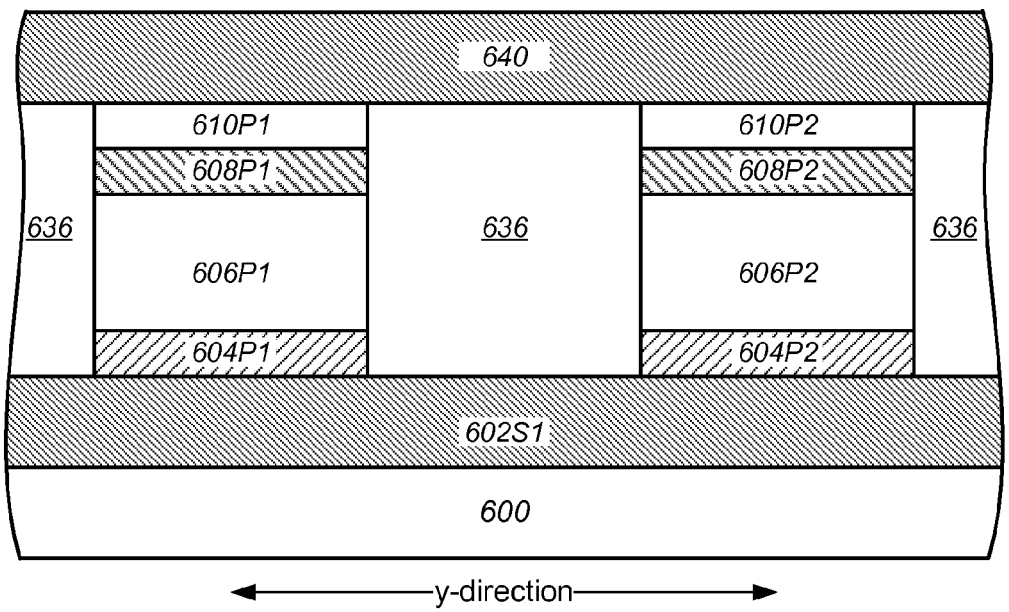
Figure 8G:
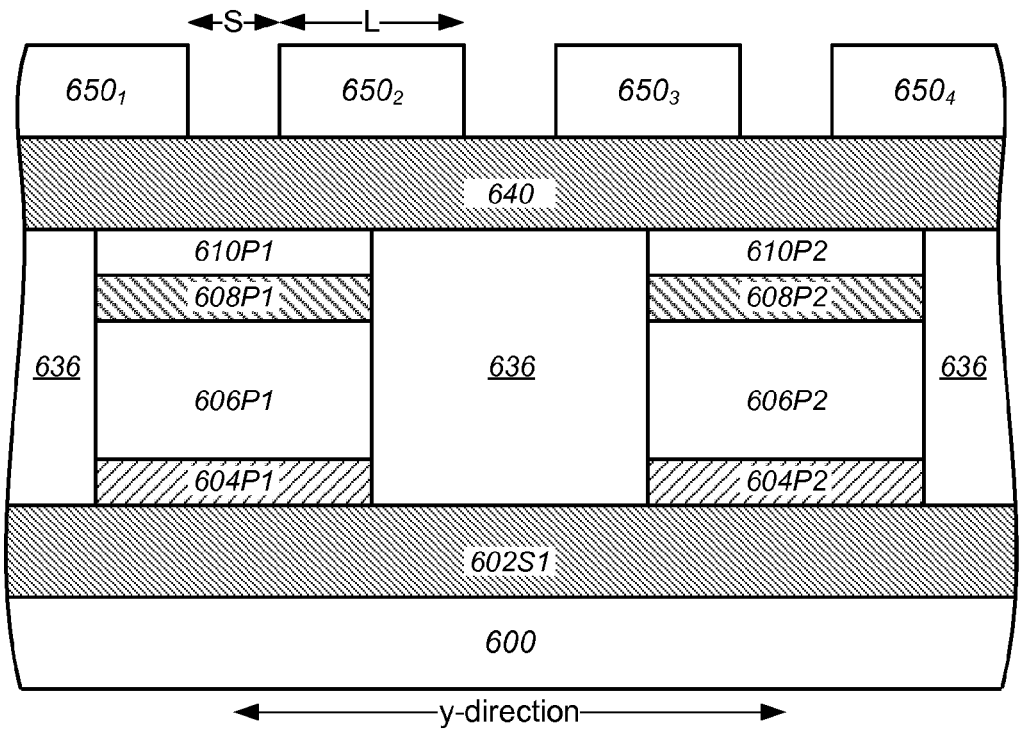

After etching to form pillars, a dielectric material 636 is deposited over the memory array to fill the open spaces between pillars as shown in FIG. 8F. Excess dielectric material can be removed using conventional techniques such as chemical mechanical polishing to form a substantially planar surface. After filling with dielectric material, a second layer 640 of conductive material is formed over the array. In one embodiment, the second layer 640 is tungsten deposited by CVD or PVD to a thickness of about 3000Å. Other materials, processes and dimensions can be used as described with respect to the first layer 602 of conductive material.

A third pattern is applied over the second conductive layer as shown in FIG. 9G. The pattern in the example of FIG. 8G includes strips $650_1$-$650_4$ of photoresist elongated over the memory array in the x-direction, with spaces between strips that are adjacent in the y-direction. The strips overlie the second conductive layer at portions thereof that are to become the second set of array lines. In the particularly disclosed example, the strips of photoresist have a dimension in the y-direction that is approximately two-thirds of the dimension of each pillar in the y-direction. With reference to pillar 630a, the right half of photoresist strip $650_1$ in the y-direction overlies the leftmost third of the pillar. Although not shown, the left half of photoresist trip $650_1$ in the y-direction overlies the rightmost third of a pillar of an adjacent strip 620b. The left half of photoresist strip $650_2$ in the y-direction overlies the rightmost third of pillar 630a. Although not shown, the right half of photoresist strip $650_2$ in the y-direction overlies the leftmost third of a pillar of an adjacent strip 620b. With one strip of photoresist overlying the leftmost third of each pillar and another strip of photoresist overlying the rightmost third of each pillar, the middle third of each pillar remains exposed after patterning. The strips in FIG. 8G have a line size L that is half the space size S between adjacent strips. More details on the alignment of the photoresist strips can be seen in FIGS. 3-6, where the word lines 306a-306d have dimensions in the y-direction corresponding to the photoresist strips shown in FIG. 8G.

Figure 8H:
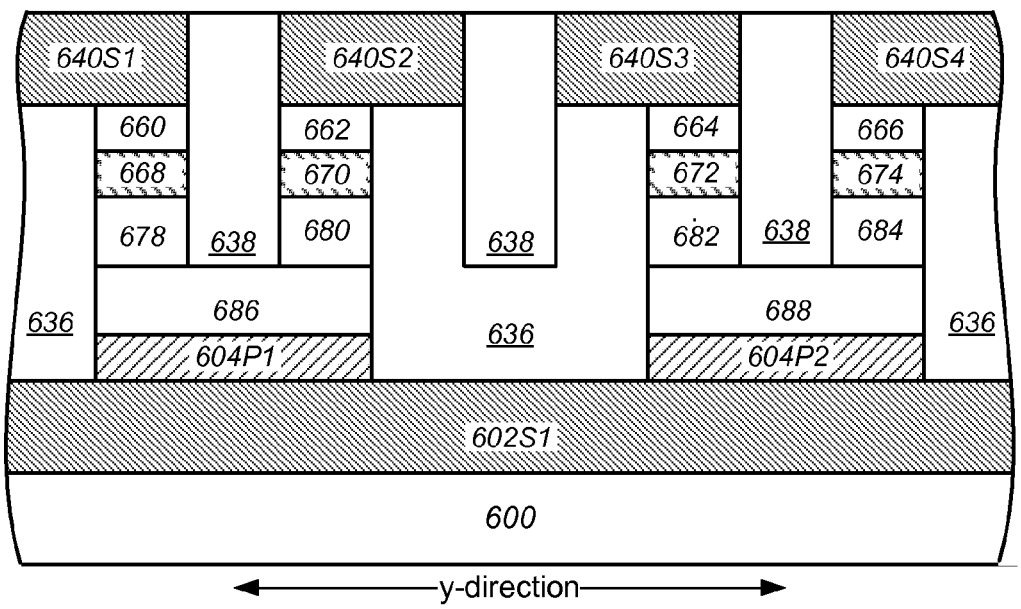

After forming the strips of photoresist, the second conductive layer and a subset of layers in each pillar are etched as shown in FIG. 8H. Conventional etch processes (e.g., reactive ion etching) can be used to etch these layers. In one embodiment, one or more selective etch processes can be applied to etch the second conductive layer and the subset of layers in each pillar without etching the previously formed dielectric material. Etching the second layer of conductive material forms a second set of array lines 640S1-640S4. These array lines are elongated across the memory array in the x-direction with spaces between array lines adjacent in the y-direction.

Etching proceeds through layers 610P1 and 608P1, forming a first state change element 660, a second state change element 662, an electrode 660 and an electrode 662. The etch process continues part of the way into the intrinsic layer 606P1, forming a first intrinsic region 678, a second intrinsic region 680 and a third intrinsic region 686. A first memory cell in pillar 630a includes state change element 660 and a first diode having a first electrode 604P1 and second electrode 668 separated by intrinsic regions 678 and 686. A second memory cell includes state change element 662 and a second diode sharing first electrode 604P1 with the first memory cell and having a second electrode 670 separated therefrom by intrinsic regions 686 and 680. Similarly, pillar 630b includes a first memory cell including state change element 664 and a first diode having first electrode 604P2 and second electrode 672 separated by intrinsic regions 682 and 688. A second memory cell in pillar 630b includes state change element 666 and a second diode sharing a first electrode 604P2 with the first memory cell and having a second electrode 674 separated by intrinsic regions 684 and 680. It is important that the etch process fully remove the semiconductor material between adjacent portions of the layers in a single pillar. If the material is not fully removed, inadvertent stringers may electrically connect one semiconductor layer of one portion of the pillar with an adjacent layer in the other portion of the pillar. This condition may cause disturb and leakage issues when operating the memory cell. By sensing the state of the memory cell at the conductor on which the common first diode electrode is formed, the effects of leakage between portions of the pillar can be reduced. It is noted however, that sensing may also take place at the conductor on the opposite end surface, where a first portion contacts one conductor and a second portion contacts a different conductor.

It is noted that the fabrication in FIGS. 8A-8H depicts the formation of a first memory level over substrate 600. It will be appreciated that the various layers and processes applied thereto may also be used to form a memory level over one or more underlying memory levels. In a half or fully-mirrored arrangement for example, conductive material layer 602 may be formed over previously formed pillar structures to form array lines that are shared by the underlying pillars and overlying pillars that can be formed as hereinafter described. In a non-mirrored arrangement or half-mirrored arrangement in which conductive material layer 602 does not form array lines that are shared between memory levels, layer 602 can be formed over an insulating layer separating the underlying memory level from the memory level to be formed as hereinafter described.

Figure 9:
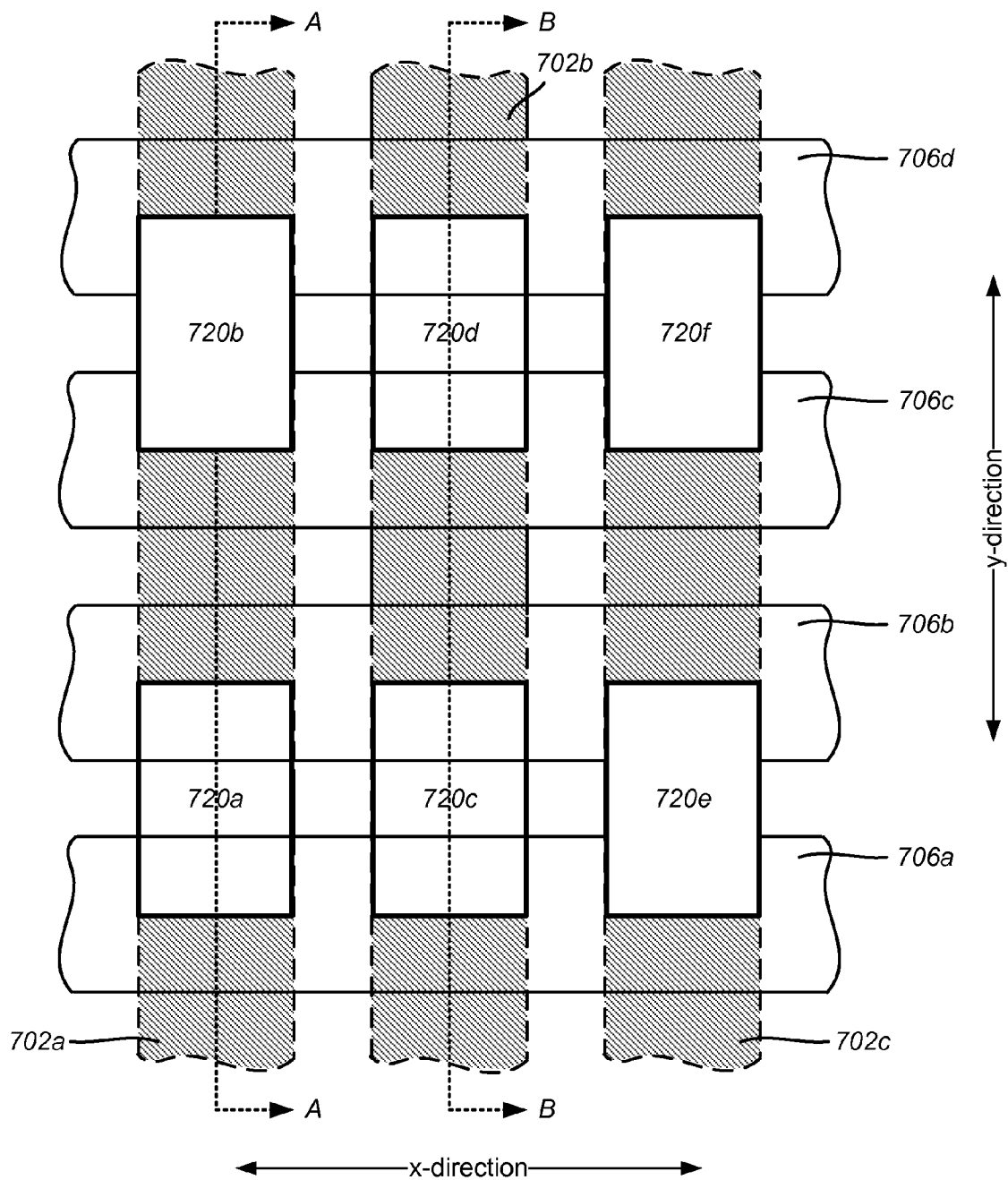
FIG. 9 is an overhead view depicting a portion of a three-dimensional non-volatile memory in accordance with one embodiment.

FIG. 9 is an overhead depiction of an alternate arrangement of a shared pillar monolithic three-dimensional non-volatile memory array in accordance with the present disclosure. First and second sets of substantially orthogonal array lines are arranged over a substrate as in FIG. 3. Conductors 706a-706d of the second set overlie conductors 702a-702c of the first set, and are depicted transparently so as not to obscure the underlying features.

A set of vertically-oriented shared pillars 720a-720f is formed between the first set of array lines and the second set of array lines. Similar to the arrangement in FIG. 3, each pillar is in communication with one array line from the first set of array lines and two array lines from the second set of array lines. A first terminal portion of each pillar connects to the array line from the first set and a second terminal portion connects to both array lines from the second set. Shared pillar 720c, for example, includes a first end surface contacting array line 702b of the first set of array lines and includes a second end surface contacting both array lines 706a and 706b of the second set of array lines. Two memory cells are formed in each shared pillar using a first subset of layers that is divided into electrically isolated portions and a second subset of layers that is not divided. The pillars in FIG. 9 span (in the y-direction) from about the middle of one conductor from the second set to about the middle of an adjacent conductor of the first set. In another embodiment, the pillars may span from the edge of one conductor to the edge of an adjacent conductor. The conductors of the second set will thus overlie a larger portion of the pillar. In one example, the pillars have a dimension in the y-direction that is three times the dimension of the of the pillar in the x-direction (which is equal to the dimension of the first set of conductors in the x-direction).

Recall that in FIG. 3 the pillars were arranged in a staggered or checkerboard architecture. In the column or y-direction, a pillar was formed at every other cross-point where two adjacent conductors of the second set overlie one conductor of the first set. In that arrangement, there are u/2 shared pillars in a column, where u is equal to the number of conductors in the second set (x array lines). This is the same for the embodiment of FIG. 9. A shared pillar is formed at every other cross-point where two adjacent conductors of the second set overlie a conductor of the first set. Like FIG. 3, there are u/2 shared pillars in the column direction.

FIG. 9 differs from FIG. 3 in the specific arrangement of the pillars at the intersections of the array lines in the row direction. In the row direction of FIG. 3, a shared pillar is formed at every other cross-point where two adjacent conductors of the second set overlie one conductor of the first set. This results in a number of pillars in the column direction equal to v/2, where v is equal to the number of conductors in the first set (y array lines). By contrast, in FIG. 9 a pillar is formed at every cross-point where two adjacent conductors overlie one conductor of the first set in the row direction. Thus, the number of pillars in a row is equal to the number of conductors of the first set.

Figure 10:
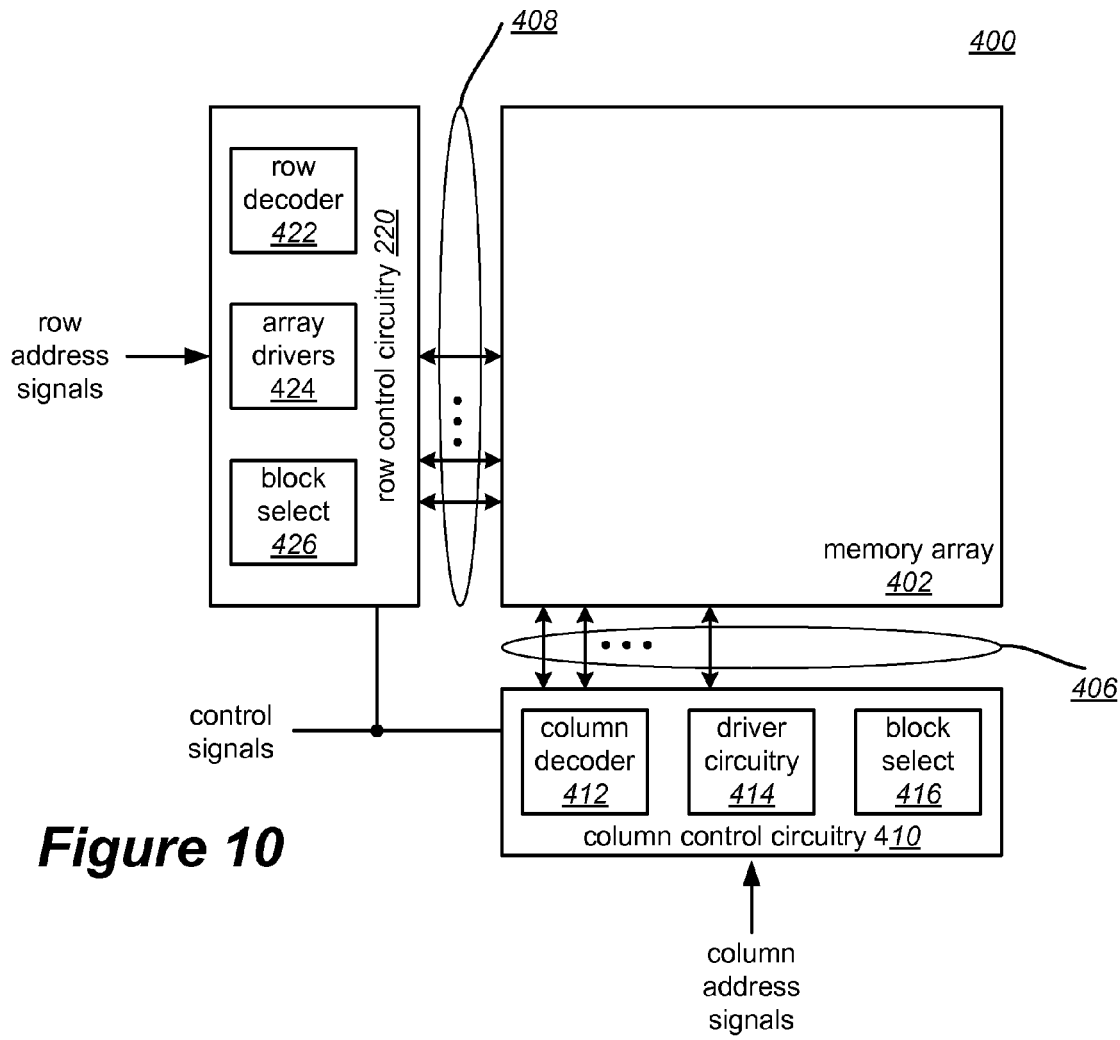
FIG. 10 is a block diagram of a non-volatile memory system.

FIG. 10 is a block diagram of an exemplary integrated circuit including a memory array 402 that may be formed in accordance with the previously described embodiments. The array terminal lines of memory array 402 include the various layer(s) of word lines organized as rows, and the various layer(s) of bit lines organized as columns. The integrated circuit 400 includes row control circuitry 420 whose outputs 408 are connected to respective word lines of the memory array 402. The row control circuitry receives a group of M row address signals and one or more various control signals, and typically may include such circuits as row decoders 422, array terminal drivers 424, and block select circuitry 426 for both read and write (i.e., programming) operations. The integrated circuit 400 also includes column control circuitry 410 whose input/outputs 406 are connected to respective bit lines of the memory array 402. The column control circuitry 406 receives a group of N column address signals and one or more various control signals, and typically may include such circuits as column decoders 412, array terminal receivers or drivers 414, block select circuitry 416, as well as read/write circuitry, and I/O multiplexers. Circuits such as the row control circuitry 220 and the column control circuitry 410 may be collectively termed control circuitry or array terminal circuits for their connection to the various array terminals of the memory array 402.

Exemplary bias conditions for programming a memory cell can include driving a high voltage on an array line corresponding to the anode of the memory cell and driving the other array line to ground. For example, a voltage of 9.5V may be applied in some implementations to breach an antifuse layer for a memory cell. It is possible when programming a selected memory cell to inadvertently program an unselected memory cell, causing program disturb. In shared pillar implementations where two memory cells share a common pillar, the bias conditions for programming and sensing can be chosen to minimize the effects of program disturb.

Figure 11:
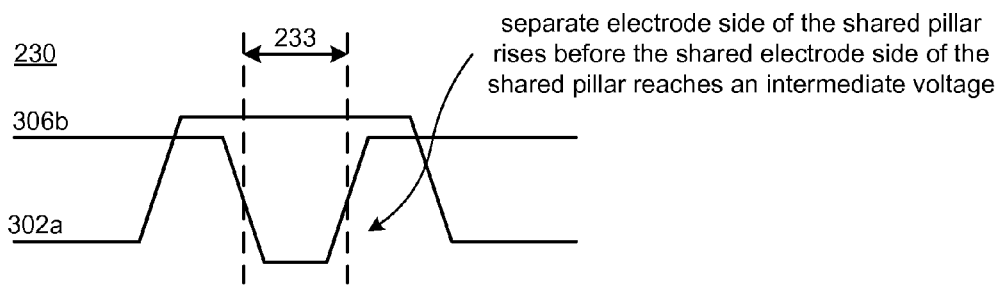
FIG. 11 is a timing diagram for programming a non-volatile memory cell in accordance with one embodiment.

With reference to FIG. 4, a first memory cell in pillar 320b is addressable via bit line 302a and word line 306b. This memory cell may be programmed by driving a high voltage on bit line 302a, while grounding word line 306b. FIG. 11 depicts one programming pulse timing arrangement 230 that may be used to program a shared pillar memory cell like that in pillar 320b. The bit line initially transitions from its unselected bias level to its selected bias level. Then, the selected word line transitions from its unselected bias level to ground, and returns to the unselected level after a programming pulse time 233. Finally, the selected bit line transitions back to its unselected bias level. As shown, the selected word line pulse falls entirely within the selected bit line pulse, and the separate electrode side of the shared pillar, which could act as an injector to the unselected cell, rises before the shared electrode side of the shared pillar reaches an intermediate voltage. For more information on bias conditions that can be applied, see U.S. Pat. No. 7,022,572, incorporated by reference herein in its entirety. In other embodiments 302a and all the first set of array lines are used as word lines and 306b and all the second set of array lines are used as bit lines.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory, comprising:
a first set of array lines elongated in a first direction;
a second set of array lines elongated in a second direction substantially orthogonal to the first direction, the second set of array lines being vertically separated from the first set of array lines; and
a set of pillars in communication with the first set of array lines and the second set of array lines, each pillar of the set of pillars including a first end surface and a second end surface, the first end surface connecting to one array line of the first set of array lines, the second end surface having a first portion connecting to one array line of the second set of array lines and a second portion connecting to a different array line of the second set of array lines, said each pillar including a first non-volatile storage element having a state change element and a steering element and a second non-volatile storage element having a state change element and a steering element, the first portion of the second end surface of said each pillar having a dimension in the first direction that is less than a dimension of the array lines of the second set in the first direction, the second portion of the second end surface of said each pillar having a dimension in the first direction that is less than the dimension of the array lines of the second set in the first direction.

2. A non-volatile memory according to claim 1, wherein:
the first set of array lines is used to sense a data state of the first non-volatile storage element and the second non-volatile storage element in each pillar of the set of pillars.

3. A non-volatile memory according to claim 1, wherein:
the set of pillars includes a first pillar;
the first end surface of the first pillar connects to a first array line of the first set of array lines;
the first portion of the second end surface of the first pillar connects to a second array line of the second set of array lines and a the second portion of the second end surface of the first pillar connects to a third array line of the second set of array lines;
the first non-volatile storage element of the first pillar is addressable by the first array line and the second array line; and
the second non-volatile storage element of the first pillar is addressable by the first array line and the third array line.

4. A non-volatile memory according to claim 3, wherein:
the first pillar includes a first electrode, a second electrode, a third electrode, a first intrinsic region, a first state change element and a second state change element;
the first non-volatile storage element of the first pillar includes the first state change element and a first diode, the first diode formed from the first electrode, the second electrode and the first intrinsic region; and
the second non-volatile storage element of the first pillar includes the second state change element and a second diode, the second diode formed from the first electrode, the third electrode and the first intrinsic region.

5. A non-volatile memory according to claim 4, wherein:
the first pillar includes a dielectric material separating the second electrode from the third electrode and separating the first state change element from the second state change element;

the second electrode and the third electrode are formed from a common layer of conductive material formed at a first height above a substrate; and
the first state change element and the second state change element are formed from a common layer of state change material formed at a second height above the substrate.

6. A non-volatile memory according to claim 4, wherein:
the first intrinsic region is lightly doped.

7. A non-volatile memory according to claim 1, wherein:
the first state change element and the second state change element are antifuses.

8. A non-volatile memory according to claim 1, wherein:
the first state change element and the second state change element are re-writable resistance state change elements.

9. A non-volatile memory according to claim 1, wherein:
the first set of array lines, the second set of array lines and the set of pillars are part of a monolithic three-dimensional memory array including at least two memory levels.

10. A non-volatile memory, comprising:
a first conductor;
a second conductor vertically-separated from the first conductor;
a third conductor vertically-separated from the first conductor, the third conductor being substantially parallel to the second conductor;
a pillar including a first non-volatile storage element and a second non-volatile storage element, the pillar having a first end surface and a second end surface, the first end surface being in contact with the first conductor, the second end surface having a first portion in contact with the second conductor and a second portion in contact with the third conductor;
a first non-volatile storage element formed in the pillar, the first non-volatile storage element including a first diode and a first state change element, the first diode having a first electrode terminating at the first end surface of the pillar and a second electrode separated from the first electrode by a first semiconductor region, the first electrode having a dimension in a first direction that is less than a dimension of the first conductor in the first direction; and
a second non-volatile storage element formed in the pillar, the second non-volatile storage element including a second diode and a second state change element, the second diode sharing the first electrode with the first diode and having a third electrode separated from the first electrode by the first semiconductor region.

11. A non-volatile memory according to claim 10, wherein:
the second electrode of the first diode is separated from the first electrode by the first semiconductor region and a second semiconductor region; and
the third electrode of the second diode is separated from the first electrode by the first semiconductor region and a third semiconductor region.

12. A non-volatile memory according to claim 11, wherein:
the first state change element terminates at the first portion of the second end surface and contacts the second electrode; and
the second state change element terminates at the second portion of the second end surface and contacts the third electrode.

13. A non-volatile memory according to claim 12, wherein:
the first state change element contacts the second semiconductor region and the second electrode, the second electrode terminating at the first portion of the second end surface; and
the second state change element contacts the third semiconductor region and the third electrode, the third electrode terminating at the second portion of the second end surface.

14. A non-volatile memory according to claim 10, wherein:
the pillar includes a dielectric material separating the second electrode from the first electrode; and
the dielectric material separates the first state change element from the second state change element.

15. A non-volatile memory, comprising:
a first set of conductors elongated in a first direction;
a second set of conductors elongated in a second direction substantially orthogonal to the first direction, the second set of conductors vertically separated from the first set of conductors;
a first pillar having a first end surface in contact with a first conductor of the first set of conductors and a second end surface in contact with a first conductor of the second set of conductors and a second conductor of the second set of conductors;
a first diode formed in the first pillar having a first electrode terminating at the first end surface and a second electrode separated from the first electrode by at least a first semiconductor region;
a second diode formed in the first pillar sharing the first electrode with the first diode and having a third electrode separated from the first electrode by at least the first semiconductor region;
a second pillar adjacent to the first pillar in the second direction, the second pillar having a first end surface in contact with a second conductor of the first set of conductors, the second pillar having a second end surface in contact with the first conductor of the second set of conductors and the second conductor of the second set of conductors;
a third diode formed in the second pillar having a fourth electrode terminating at the first end surface of the second pillar and a fifth electrode separated from the fourth electrode by at least a second semiconductor region, the fourth electrode of the second pillar being physically separate from the first electrode of the first pillar; and
a fourth diode formed in the second pillar sharing the fourth electrode with the third diode and having a sixth electrode separated from the fourth electrode by at least the second semiconductor region.

16. A non-volatile memory according to claim 15, wherein:
the first pillar has a length in the first direction and a width in the second direction; and
the length in the first direction is more than twice the width in the second direction.

17. A non-volatile memory, comprising:
a first set of conductors elongated in a first direction;
a second set of conductors elongated in a second direction substantially orthogonal to the first direction, the second set of conductors vertically separated from the first set of conductors;
a first pillar having a first end surface in contact with a first conductor of the first set of conductors and a second end surface in contact with a first conductor of the second set of conductors and a second conductor of the second set of conductors;
a first diode formed in the first pillar having a first electrode terminating at the first end surface and a second electrode separated from the first electrode by at least a first semiconductor region;
a second diode formed in the first pillar sharing the first electrode with the first diode and having a third electrode separated from the first electrode by at least the first semiconductor region;
a second pillar having a first end surface in contact with a second conductor of the first set of conductors, the second pillar having a second end surface in contact with the second conductor of the second set of conductors and a third conductor of the second set of conductors, the second end surface is not in contact with the first conductor of the second set of conductors;
a third diode formed in the second pillar having a fourth electrode terminating at the first end surface of the second pillar and a fifth electrode separated from the fourth electrode by at least a second semiconductor region, the fourth electrode of the second pillar being physically separate from the first electrode of the first pillar; and
a fourth diode formed in the second pillar sharing the fourth electrode with the third diode and having a sixth electrode separated from the fourth electrode by at least the second semiconductor region.

18. A non-volatile memory according to claim 17, wherein:
the first and second pillars are part of a set of pillars in communication with the first set of conductor and the second set of conductors;
the first set of conductor and the second set of conductor cross at a number of locations; and
a number of pillars in the set of pillars is substantially less than the number of locations at which the first set of conductors and the second set of conductors cross.

19. A non-volatile memory according to claim 18, wherein:
the number of pillars in the set is substantially half of the number of locations at which the first set of conductors and the second set of conductors cross.

20. A non-volatile memory, comprising:
a first set of conductors elongated in a first direction;
a second set of conductors elongated in a second direction substantially orthogonal to the first direction, the second set of conductors vertically separated from the first set of conductors;
a first pillar having a first end surface in contact with a first conductor of the first set of conductors and a second end surface in contact with a first conductor of the second set of conductors and a second conductor of the second set of conductors;
a first diode formed in the first pillar having a first electrode terminating at the first end surface and a second electrode separated from the first electrode by at least a first semiconductor region;
a second diode formed in the first pillar sharing the first electrode with the first diode and having a third electrode separated from the first electrode by at least the first semiconductor region;
a second pillar adjacent to the first pillar in the first direction, the second pillar having a first end surface in contact with the first conductor and a second end surface in contact with a third conductor of the second set of conductors and a fourth conductor of the second set of conductors;
a third diode formed in the second pillar having a fourth electrode terminating at the first end surface of the second pillar and a fifth electrode separated from the fourth electrode by at least a second semiconductor region, the fourth electrode of the second pillar being physically separate from the first electrode of the first pillar; and a fourth diode formed in the second pillar sharing the fourth electrode with the third diode and having a sixth electrode separated from the fourth electrode by at least the second semiconductor region.

21. A non-volatile memory according to claim 20, wherein: there is no pillar having a first end surface in contact with the first conductor of the first set of conductors and a second end surface in contact with the second conductor of the second set of conductors and the third conductor of the second set of conductors.

22. A non-volatile memory, comprising:

a first array line elongated in a first direction over a substrate;

a second array line elongated in a second direction over the substrate and vertically separated from the first array line, the second direction being substantially orthogonal to the first direction;

a third array line elongated in the second direction over the substrate and vertically separated from the first array line, the second array line and the third array line being substantially coplanar and substantially parallel array lines;

a pillar having a first end surface in contact with the first array line and a second end surface with a first portion in contact with the second array line and a second portion in contact with the third array line;

a first state change element formed in the pillar and terminating at the first portion of the second end surface;

a second state change element formed in the pillar and terminating at the second portion of the second end surface, the first state change element and the second state change element being separated in the first direction by a dielectric material;

a first diode in series with the first state change element, the first diode having a first electrode terminating at the first end surface of the pillar and a second electrode separated from the first electrode by a first intrinsic region and a second intrinsic region; and a second diode in series with the second state change element, the second diode sharing the first electrode with the first diode and having a third electrode separated from the first electrode by the first intrinsic region and a third intrinsic region, the second electrode and the third electrode being separated in the first direction by the dielectric material.

23. A non-volatile memory according to claim 22, wherein:

the first state change element and the second state change element are formed from a commonly deposited layer of state change material; and the second electrode and the third electrode are formed from a commonly deposited layer of state change material.

24. A non-volatile memory according to claim 23, wherein:

a sum of a width in the first direction of the second electrode, the third electrode and the dielectric material is equal to a width in the first direction of the first electrode;

the width of the first electrode in the first direction is equal to a width of the pillar in the first direction.

25. A non-volatile memory according to claim 1, wherein:

each pillar includes a first subset of layers that are divided along the first direction; and each pillar includes a second subset of layers that is shared between the corresponding first non-volatile storage element and second non-volatile storage element.

26. A non-volatile memory according to claim 25, wherein:

the first subset of layers in each pillar includes a first intrinsic layer divided along the first direction; and the second subset of layers in each pillar includes a second intrinsic region.

27. A non-volatile memory according to claim 25, wherein:

the second end surface of each pillar connects to exactly two array lines of the second set of array lines.

28. A non-volatile memory according to claim 10, wherein:

each pillar includes a first subset of layers that are divided along the first direction; and each pillar includes a second subset of layers that is shared between the corresponding first non-volatile storage element and second non-volatile storage element.

29. A non-volatile memory according to claim 11, wherein:

the first semiconductor region is a first intrinsic region;

the second semiconductor region is a second intrinsic region; and the third semiconductor region is a third intrinsic region.

* * * * *